(12) United States Patent
Ochoa et al.

(10) Patent No.: US 8,729,960 B2
(45) Date of Patent: May 20, 2014

(54) DYNAMIC ADJUSTING RFID DEMODULATION CIRCUIT

(75) Inventors: Agustin Ochoa, Vista, CA (US); Bardia Pishdad, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 49 days.

(21) Appl. No.: 13/490,285

(22) Filed: Jun. 6, 2012

(65) Prior Publication Data

US 2012/0313698 A1  Dec. 13, 2012

Related U.S. Application Data

(60) Provisional application No. 61/495,700, filed on Jun. 10, 2011.

(51) Int. Cl.
*H03K 9/00* (2006.01)

(52) U.S. Cl.
USPC ........ 329/347; 329/349; 329/311; 340/572.4; 340/10.1

(58) Field of Classification Search
USPC ........ 329/347, 349; 340/572.4, 10.1; 375/353
See application file for complete search history.

(56) References Cited

U.S. PATENT DOCUMENTS

| | | | |
|---|---|---|---|
| 4,128,816 A | 12/1978 | Shimotsuma |
| 4,217,540 A | 8/1980 | Shimotsuma |
| 4,250,464 A | 2/1981 | Schade, Jr. |
| 4,300,061 A | 11/1981 | Mihalich et al. |
| 4,477,737 A | 10/1984 | Ulmer et al. |
| 4,533,970 A | 8/1985 | Brown |
| 4,644,300 A | 2/1987 | Ibe et al. |
| 4,857,823 A | 8/1989 | Bitting |
| 5,039,934 A | 8/1991 | Banaska |
| 5,159,216 A | 10/1992 | Taylor et al. |
| 5,187,389 A | 2/1993 | Hall et al. |
| 5,434,534 A | 7/1995 | Lucas |
| 5,515,226 A | 5/1996 | Tailliet |
| 5,559,451 A | 9/1996 | Okamura |
| 5,708,549 A | 1/1998 | Croft |
| 5,796,295 A | 8/1998 | Sharpe-Geisler |
| 5,870,000 A | 2/1999 | Matsuda et al. |
| 5,945,920 A | 8/1999 | Maletsky |
| 6,208,197 B1 | 3/2001 | Ternullo, Jr. et al. |
| 6,225,664 B1 | 5/2001 | Endo et al. |
| 6,229,290 B1 | 5/2001 | Nguyen et al. |
| 6,281,743 B1 | 8/2001 | Doyle |
| 6,566,850 B2 | 5/2003 | Heinrich |
| 6,625,231 B1 | 9/2003 | Shen |
| 6,642,757 B2 | 11/2003 | Ikehashi et al. |
| 6,713,991 B1 | 3/2004 | McCallum |
| 6,737,908 B2 | 5/2004 | Mottola et al. |
| 6,768,222 B1 | 7/2004 | Ricks |
| 6,784,705 B2 | 8/2004 | Kamata |
| 6,794,856 B2 | 9/2004 | Fernald |
| 6,858,917 B1 | 2/2005 | Ranucci |
| 6,901,012 B2 | 5/2005 | Ikehashi et al. |
| 6,933,770 B1 | 8/2005 | Ranucci |

(Continued)

*Primary Examiner* — Arnold Kinkead

(57) ABSTRACT

A dynamic adjusting RFID demodulator circuit includes an envelope detector having an input for receiving a modulated RF signal, a fixed reference generator coupled to the input of an RC filter, an RF level dependent signal path adding to the fixed reference level at higher RF energy levels, a comparator having a first input coupled to an output of the envelope detector, a second input coupled to an output of the RC filter, and an output for providing a data output signal.

20 Claims, 27 Drawing Sheets

(56) References Cited

U.S. PATENT DOCUMENTS

| | | |
|---|---|---|
| 7,116,088 B2 | 10/2006 | Tran et al. |
| 7,116,240 B2 | 10/2006 | Hyde |
| 7,119,526 B2 | 10/2006 | Fernald |
| 7,133,269 B2 | 11/2006 | Lundberg |
| 7,161,338 B2 | 1/2007 | Jiang et al. |
| 7,436,732 B2 | 10/2008 | Hirobe |
| 7,471,143 B2 | 12/2008 | Kim |
| 7,554,377 B1 | 6/2009 | Guan |
| 7,679,412 B2 | 3/2010 | Ogiwara et al. |
| 7,679,957 B2 | 3/2010 | Ma et al. |
| 7,710,783 B2 | 5/2010 | Ning |
| 7,715,236 B2 | 5/2010 | Hyde |
| 7,732,945 B2 | 6/2010 | Gotoh et al. |
| 7,876,150 B2 * | 1/2011 | Iwata et al. .................... 329/311 |
| 2007/0126584 A1 * | 6/2007 | Hyde et al. ................. 340/572.4 |
| 2007/0210923 A1 | 9/2007 | Butler et al. |
| 2007/0290660 A1 | 12/2007 | Yamazaki |
| 2008/0106416 A1 | 5/2008 | Sullivan et al. |
| 2008/0180249 A1 | 7/2008 | Butler et al. |
| 2008/0189567 A1 | 8/2008 | Goodnow et al. |
| 2009/0289776 A1 | 11/2009 | Moore et al. |

* cited by examiner

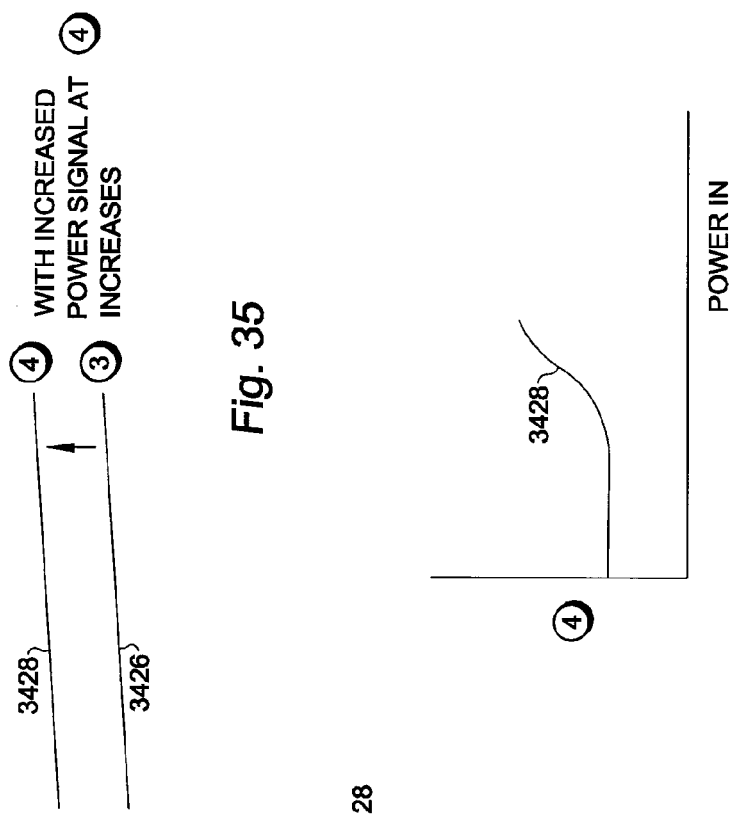
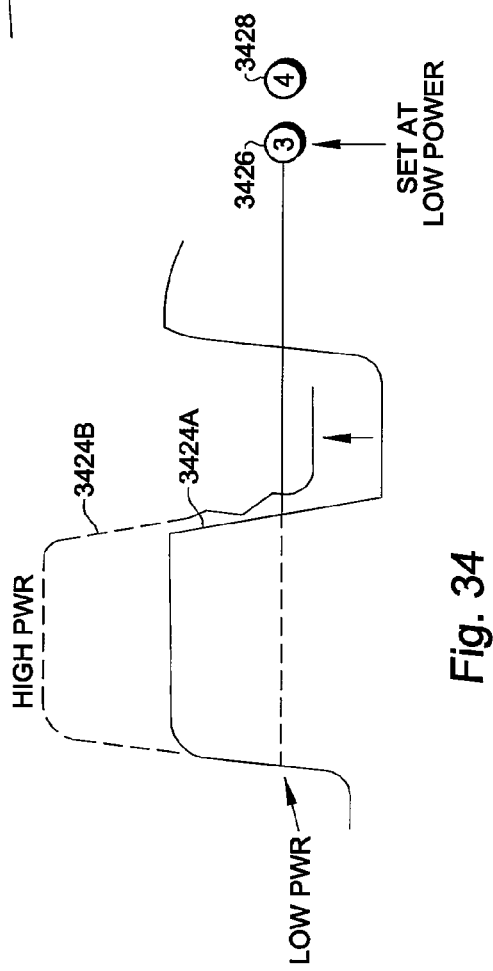
Fig. 34
Fig. 35
Fig. 36

US 8,729,960 B2

DYNAMIC ADJUSTING RFID DEMODULATION CIRCUIT

CROSS REFERENCE TO RELATED PATENT APPLICATIONS

The present invention claims priority from U.S. Provisional Patent Application Ser. No. 61/495,700 filed Jun. 10, 2011, and is related to U.S. patent application Ser. No. 13/490,163, filed Jun. 6, 2012, entitled GENERATION OF VOLTAGE SUPPLY FOR LOW POWER DIGITAL CIRCUIT OPERATION, Ser. No. 13/490,254, filed Jun. 6, 2012, entitled DYNAMIC POWER CLAMP FOR RFID POWER CONTROL, Ser. No. 13/490,115, filed Jun. 6, 2012, entitled POWER-ON SEQUENCING FOR AN RFID TAG, Ser. No. 13/490,267, filed Jun. 6, 2012, entitled ANALOG DELAY CELLS FOR THE POWER SUPPLY OF AN RFID TAG, Ser. No. 13/490,236, filed Jun. 6, 2012, entitled BANDGAP READY CIRCUIT, and Ser. No. 13/490,296, filed Jun. 6, 2012, entitled SHUNT REGULATOR CIRCUIT HAVING A SPLIT OUTPUT, the disclosures of which are herein specifically incorporated by this reference in its entirety.

BACKGROUND OF THE INVENTION

1. Field of the Invention

The invention relates, in general, to the field of radio frequency identification (RFID) tags and systems. More particularly, the invention relates to numerous circuit improvements for the RFID tag for optimizing performance.

2. Discussion of the Related Art

As is well known in the art, a basic RFID system includes three components: an antenna or coil; a transceiver with decoder, i.e., RFID reader; and a transponder, i.e., RFID tag, programmed with unique information.

RFID tags are categorized as either active or passive. Active RFID tags are powered by an internal battery and are typically read/write, i.e., tag data can be rewritten and/or modified. Passive RFID tags operate without a separate external power source and obtain operating power generated from the reader.

An example of a typical passive RFID tag is shown in FIG. 1. Tag 100 includes an antenna 102 that is coupled to an analog front end circuit 104, which is in communication with a digital and memory circuit 106 through receive (RX) and transmit (TX) paths. Most passive RFID tags today use some sort of electrically erasable programmable read-only memory (EEPROM) such as flash memory.

While EEPROM memory has served in passive RFID tag applications to date, the demands for greater data throughput into and out of the RFID are increasing. This can be seen for example in factory environments, and in collecting highway tolls. The EEPROM based passive RFID tags, are slow and may not be suited for the higher throughput applications. Alternative, faster memories technologies such as FRAM ("Ferroelectric Random Access Memory") memory exist that are ideally suited for these new higher speed RFID applications. However, the RFID environment is extremely challenging for FRAM based integrated circuits, not only for the normal challenges such as the variation in process corners, temperature, and the constraints of low power operation but also for intermittent contact with the RFID reader leading to interruptions with the available power supply on the RFID tag.

What is desired, therefore, are circuit improvements for an RFID tag that will provide robust operation in a challenging RFID environment while exploiting the advantages of FRAM memory.

SUMMARY OF THE INVENTION

Accordingly, the present invention is directed to a dynamic adjusting RFID demodulation circuit that substantially obviates one or more of the problems due to limitations and disadvantages of the related art.

According to the present invention, a dynamic adjusting RFID demodulator circuit includes an envelope detector having an input for receiving a modulated RF signal, a fixed reference generator coupled to the input of an RC filter, an RF level dependent signal that adds charge to the output of the RC filter dynamically increasing the signal level from the fixed generator, a comparator having a first input coupled to an output of the envelope detector, a second input coupled to an output of the RC filter, and an output for providing a data output signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 34-36 are timing diagrams associated with the dynamic adjusting RFID demodulation circuit according to the present invention;

DETAILED DESCRIPTION OF THE ILLUSTRATED EMBODIMENTS

Figure 1:
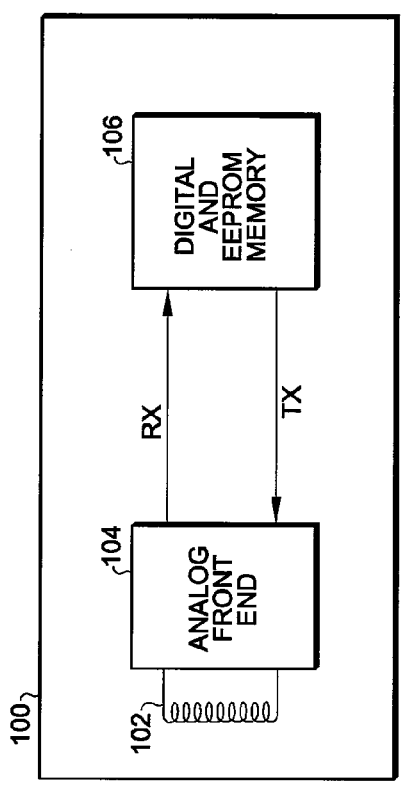
FIG. 1 is a block diagram of a prior art EEPROM based passive RFID tag.
Figure 2A:
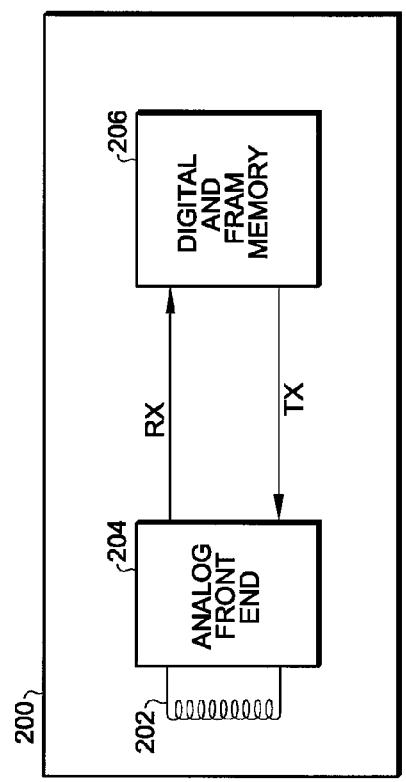
FIG. 2A is an overall block diagram of a FRAM memory based passive RFID tag according to the present invention.

Referring now to FIG. 2A, a passive RFID tag 200 according to the invention includes an antenna 202, an analog front end 204, and a digital portion 206 that includes digital control circuitry and FRAM memory and communicates with the analog front end 204 using the RX and TX paths.

Figure 2B:
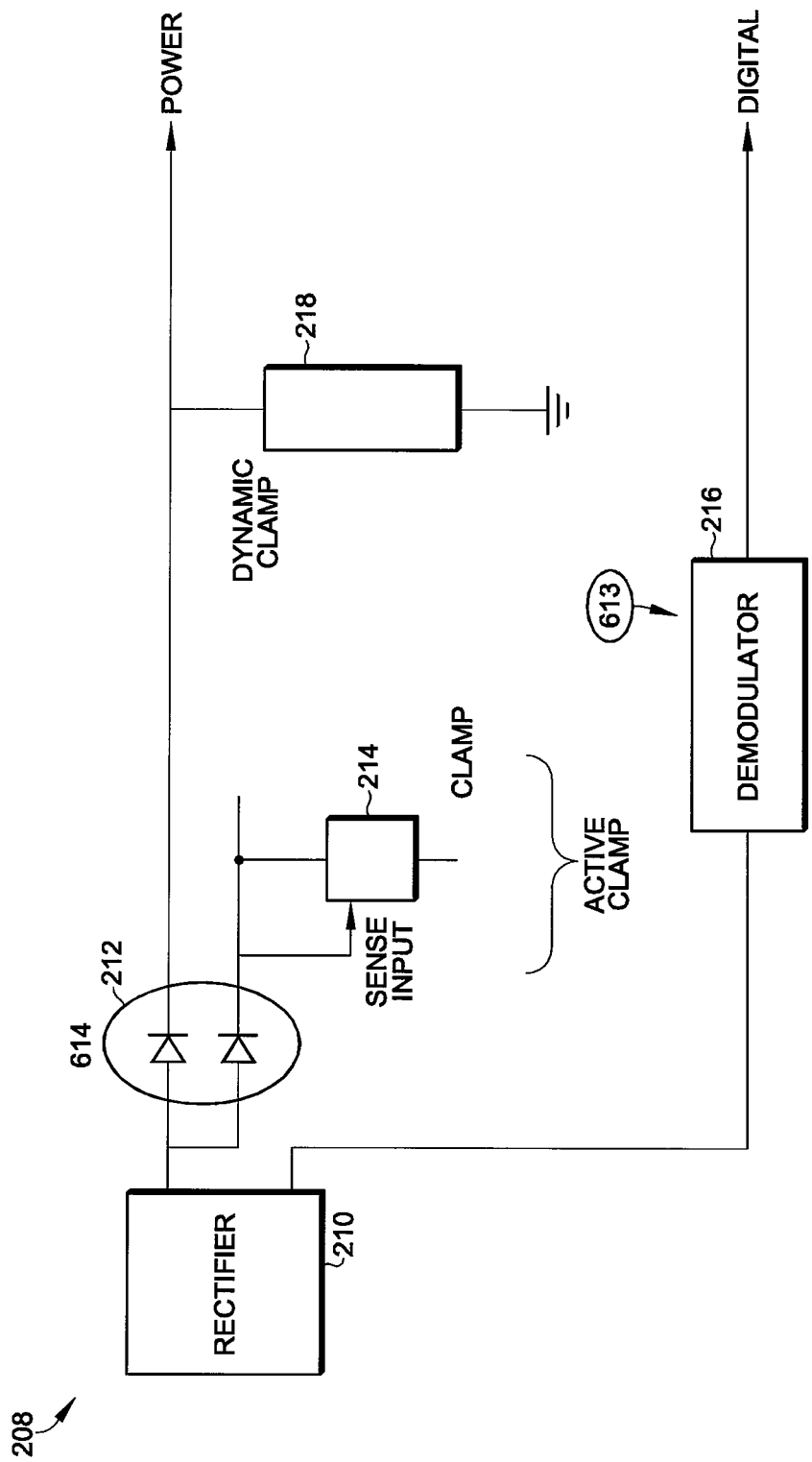
FIG. 2B is a more detailed block diagram of a first portion of the FRAM memory based passive RFID tag referred to in FIG. 2A.

Referring to FIG. 2B, a more detailed block diagram of a first portion 208 of the RFID tag 200 includes a rectifier 210, a split output 212 including two diodes described in further detail below, an active clamp 214, and a dynamic clamp 218 coupled to the VDDR power supply, which is also described in further detail below. The rectifier output is also coupled to a demodulator 216 for providing a digital output, which is also described in further detail below.

Figure 2C:
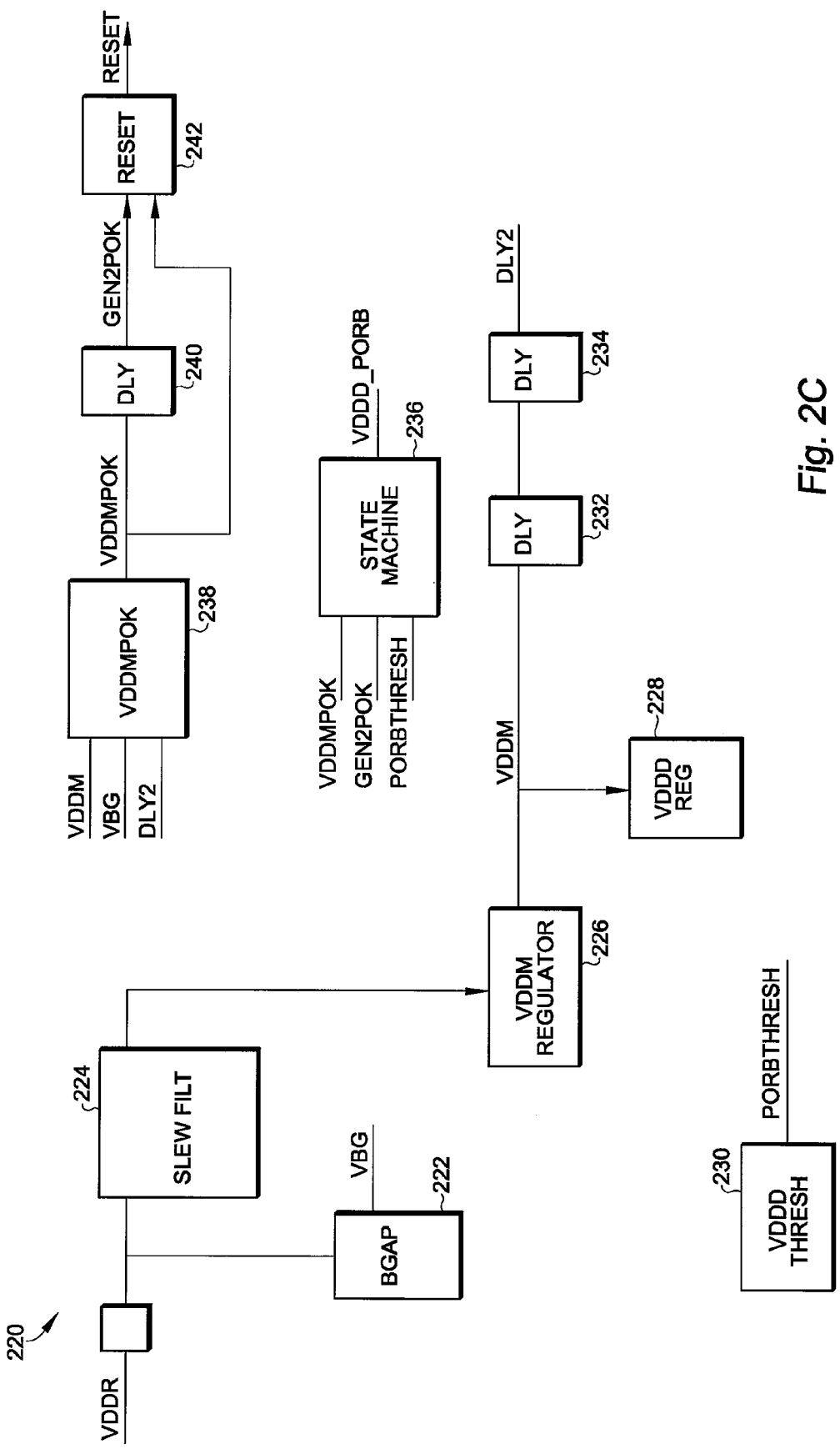
FIG. 2C is a more detailed block diagram of a second portion of the FRAM memory based passive RFID tag referred to in FIG. 2B.

Referring to FIG. 2C, a more detailed block diagram of a second portion 220 of the RFID tag 200 includes a slew filter 224 and a bandgap circuit 222 both coupled to the VDDR power supply, and both described in further detail below. The output of the slew filter is coupled to a VDDM regulator 226 for providing a VDDM supply voltage. In turn, a VDDD regulator 228 is coupled to the VDDM supply voltage, as well as delay circuits 232 and 234. The purpose and nature of these circuits is described in further detail below. A VDDMPOK circuit 238 receives the VDDM, VBG, and DLY2 signals and provides a VDDMPOK signal. A delay circuit 240 receives the VDDMPOK signal and provides a GEN2POK signal. A reset circuit 242 receives the GEN2POK and VDDMPOK signals to provide a RESET signal. Finally, circuit 236 receives the VDDMPOK, GEN2POK, and PORBTHRESH signals to provide a VDDD_PORB signal. The nature of all of these further signals and circuits is explained in further detail below. Circuit 230 monitors the VDDD threshold.

Figure 3:
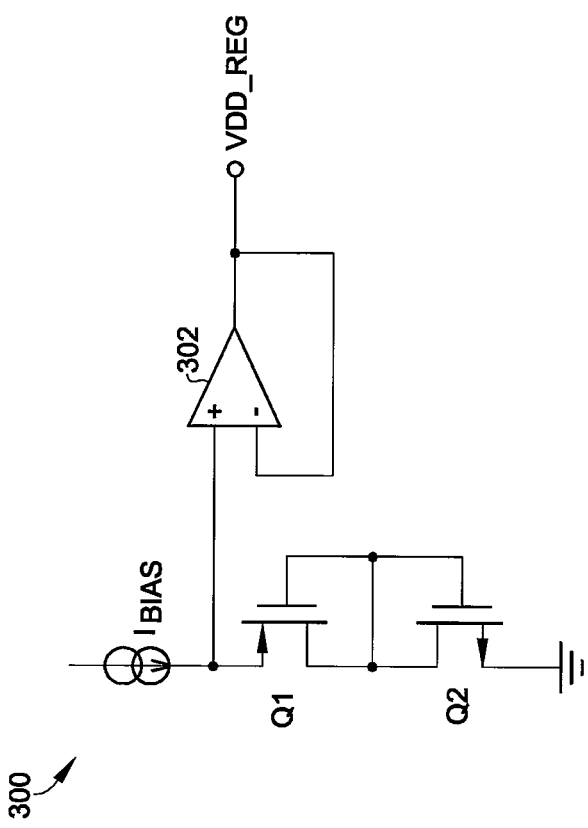
FIG. 3 is a schematic diagram of the low power voltage regulator and a buffer stage according to the present invention.

Referring now to FIG. 3 a low power voltage regulator 300 includes an output node for providing a regulated output voltage (VDD_REG), a first diode-connected transistor Q1 of a first polarity type (P-channel) in series with a second diode-connected transistor Q2 of a second polarity type (N-channel) coupled between the output node and ground. A bias current $I_{BIAS}$ has a value for biasing the first and second diode-connected transistors in a sub-threshold mode of operation as is explained in further detail below. The $I_{BIAS}$ current can be generated using a bandgap circuit or other bias current circuits as are known in the art. A buffer amplifier 302 is coupled to the output node to provide a low impedance regulated output voltage.

Figure 4:
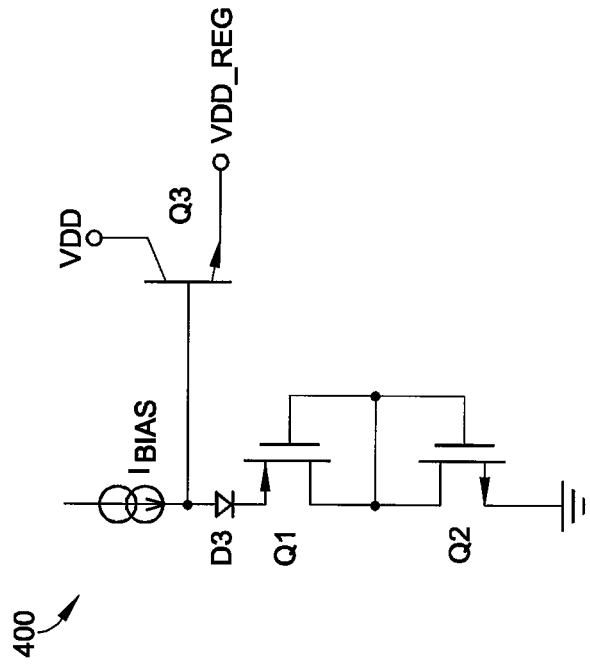
FIG. 4 is a schematic diagram of the low power voltage regulator and an emitter follower stage according to the present invention.

Referring now to FIG. 4 a low power voltage regulator 400 includes an output node for providing a regulated output voltage (VDD_REG), and a first diode-connected transistor Q1 of a first polarity type (P-channel) in series with a second diode-connected transistor Q2 of a second polarity type (N-channel) coupled between the output node and ground. A diode D3 is provided to compensate for the voltage drop seen in Q3 to the regulated voltage VDD_REG. A bias current $I_{BIAS}$ has a value for biasing the first and second diode-connected transistors in a sub-threshold mode (or other mode) of operation as is explained in further detail below, as well as diode D3. An emitter follower stage transistor Q3 is coupled to the output node (through diode D3) to provide a low impedance regulated output voltage.

Figure 5:
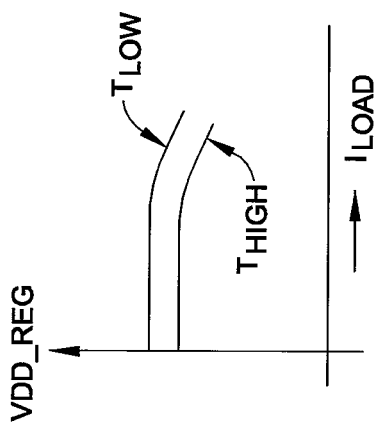
FIG. 5 is a graph of VDD_REG vs $I_{Load}$, showing the operation of the low power voltage regulator according to the present invention.

Referring now to FIG. 5, it is important to note that the total voltage across transistors Q1 and Q2 is not a constant voltage, even though the bias current, labeled $I_{BIAS}$, may be. Thus, the circuit of FIG. 4 is not a constant voltage generator. At lower temperatures a higher total voltage V2 results given a constant bias current. At higher temperatures a lower total voltage V1 results given the same constant bias current. Thus, the total voltage decreases with increased temperature change. The voltage VDD_REG is a temperature compensated voltage, which helps to provide stable circuit performance. A higher VDD_REG voltage is provided to compensate for relatively slower transistors, which occurs at lower temperatures. A lower VDD_REG voltage is provided to compensate for relatively faster transistors, which occurs at higher temperatures. The level of $I_{BIAS}$ also sets the operating mode of Q1 and Q2 as sub-threshold or higher power mode.

Figure 6:
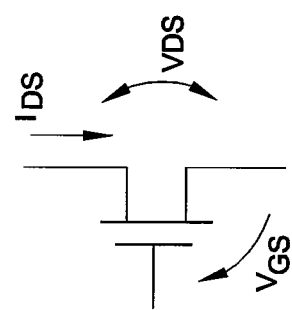
FIG. 6 is a schematic diagram of a transistor identifying voltage and currents used in the graph of FIG. 7.

Referring now to FIG. 6, a transistor is shown identifying the drain-source current (IDS), drain-source voltage ($V_{DS}$), and the gate-source voltage ($V_{GS}$) thereof.

Figure 7:
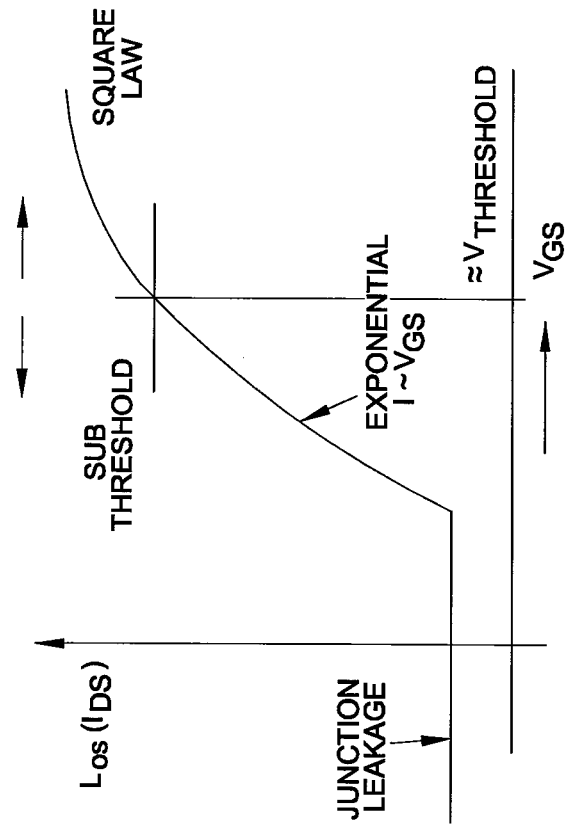
FIG. 7 is a graph of the sub-threshold operation for a transistor such as the ones used in the low power voltage regulator according to the present invention.

Referring now to FIG. 7, a graph is shown plotting the drain-source current of a transistor in response to the gate-source voltage. A threshold voltage $V_{THRESHOLD}$ is shown. Above the threshold voltage, the transistor operates in the "Square Law" mode of operation. Below the threshold voltage, the transistor operates in an exponential mode of operation, with the leakage current of the device forming a current floor level. In the circuit of FIG. 4, the bias current through transistors Q1 and Q2, as well as serially connected diode D3, is constrained to operate those transistors in the sub-threshold mode of operation for very low power operation. This insures that the circuit of FIG. 4 operates a low power mode, which is of critical importance in an RFID tag, as the available energy for circuit operation is extremely limited. With larger $I_{BIAS}$ a higher power, higher performance circuit operation is obtained.

Figure 8:
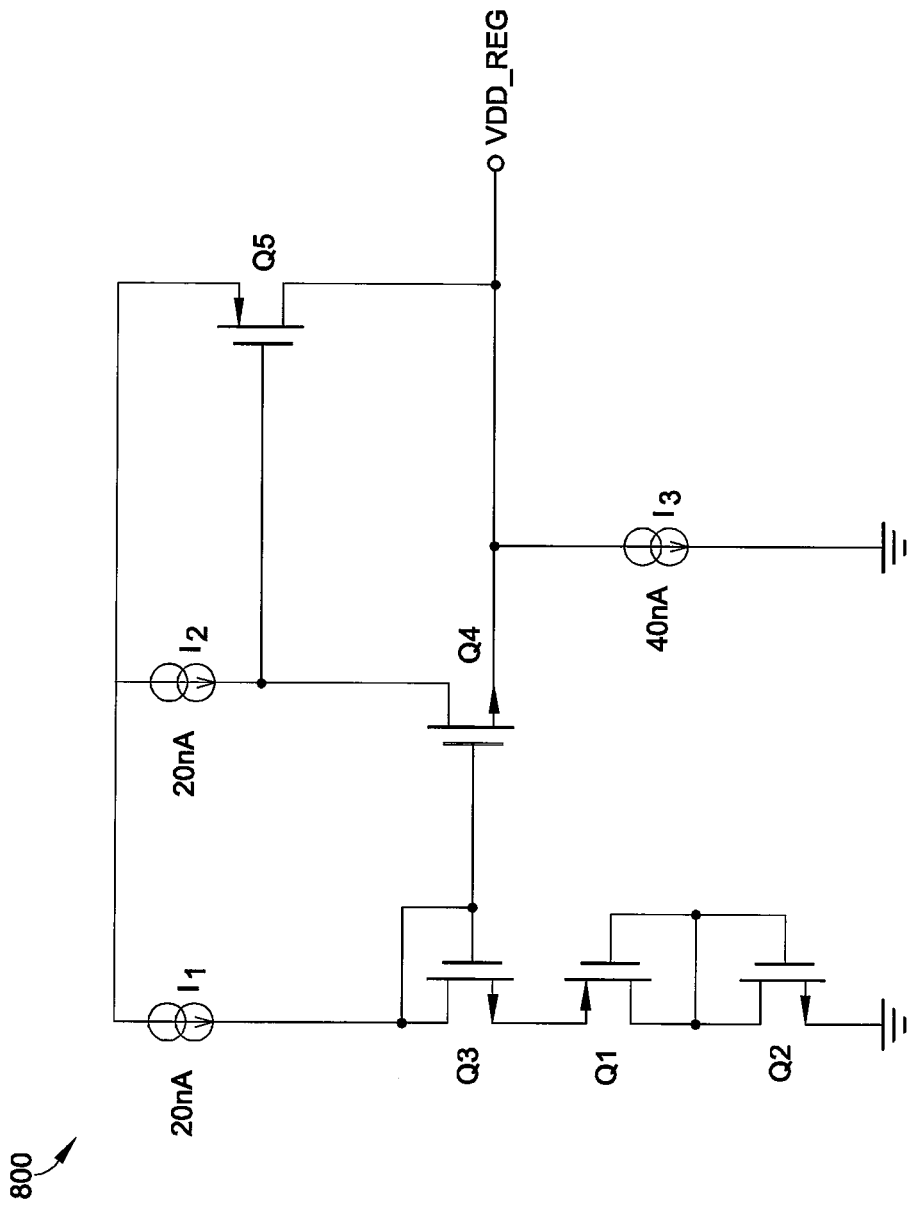
FIG. 8 is a detailed transistor-level schematic of an embodiment of the low power voltage regulator according to the present invention.

Referring now to FIG. 8, a detailed transistor-level schematic of an embodiment of the low power voltage regulator 800 is shown. Low power voltage regulator 800 includes a first diode-connected transistor Q1 of a first polarity type (P-channel) in series with a second diode-connected transistor Q2 of a second polarity type (N-channel) coupled between the output node and ground. A bias current generator $I_1$ is used to bias the first and second diode-connected transistors in a sub-threshold mode of operation. A third diode-connected transistor (Q3, N-channel) is coupled between the bias current $I_1$ and the first and second diode-connected transistors Q1 and Q2. A buffer amplifier (Q4, Q5, $I_2$, $I_3$) is coupled to the third transistor Q3 for providing a regulated output voltage VDD_REG. The buffer amplifier includes an input transistor Q4 (N-channel) having its gate forming the input of the buffer, and its source forming the output of the buffer for providing the regulated output voltage. A feedback transistor Q5 (P-channel) is also included having a gate coupled to the drain of the input transistor, a source for coupling to a power supply voltage, and a drain coupled to the source of the input transistor Q4. A first buffer bias current $I_2$ is coupled to the drain of the input transistor Q4 and a second buffer bias current $I_3$ is coupled to the source of the input transistor Q4. The value of the second bias current $I_3$ is greater than the value of the first bias current $I_2$. Representative values of the bias currents for the voltage regulator 800 in very low power operation are as follows: $I_1$ is 20 nA, $I_2$ is 20 nA, and $I_3$ is 40 nA.

Figure 9:
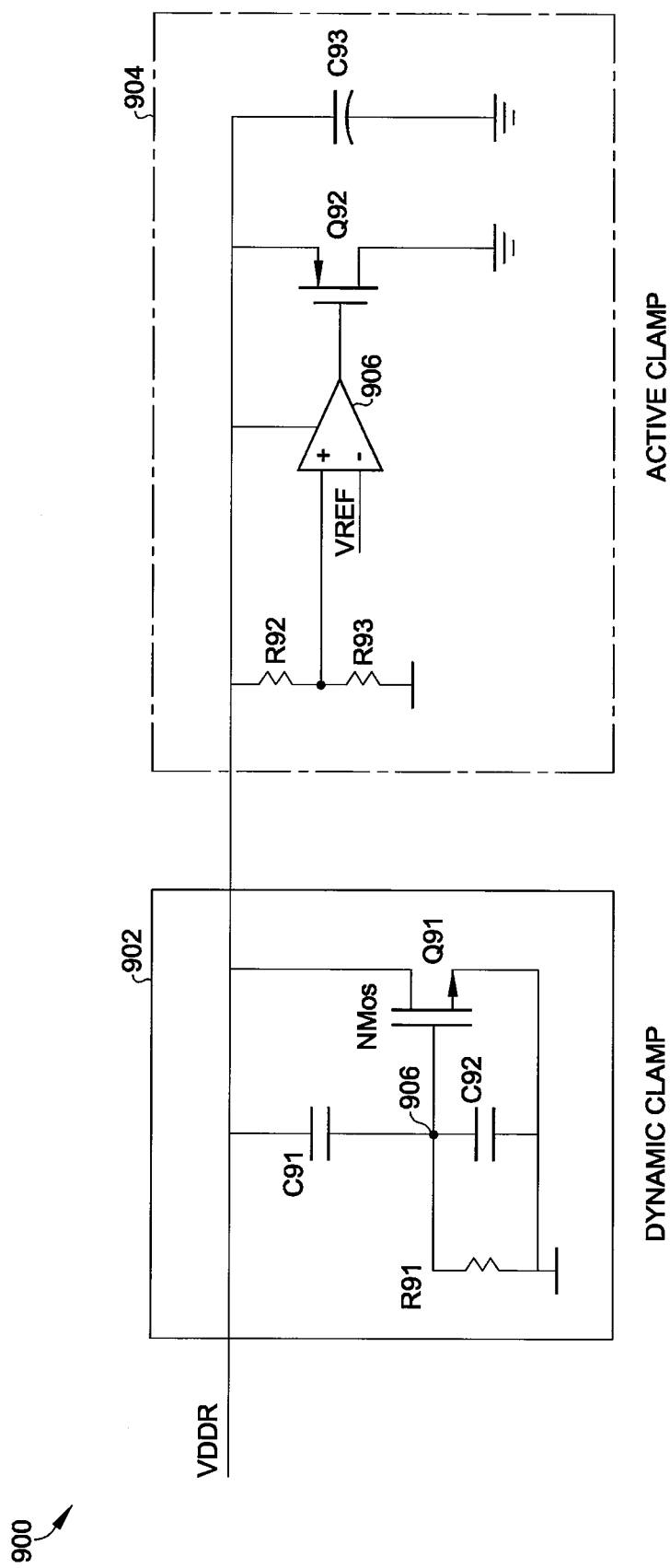
FIG. 9 is a schematic diagram of a clamping circuit for an RFID tag according to the present invention.

A clamp circuit 900 for an RFID tag is shown in FIG. 9 including a VDDR power supply node (clamped power supply voltage provided by the RFID rectifier circuit, not shown in FIG. 9), a dynamic clamp 902 coupled between the power supply node and ground, and an active clamp 904 also coupled between the power supply and ground, holding the power supply VDDR at a maximum steady state clamped value when the RF supplied power exceeds an operating minimum.

The dynamic clamp 900 includes a capacitor divider circuit including capacitors C91 and C92 coupled between the VDDR rail and ground. A resistor R91 is coupled to the capacitor divider circuit at center tap node 906. An N-channel transistor Q91 has a gate coupled to the capacitor divider circuit at center tap node 906. The drain of transistor Q91 is coupled to the VDDR rail and the source is coupled to ground.

The active clamp includes a differential amplifier 906 having a first input coupled to a resistor divider including resistors R92 and R93 at center tap node 908, a second input for receiving a reference voltage VREF, and an output coupled to a P-channel transistor Q92 for providing the clamped VDDR voltage. The differential amplifier 906 can be an operational amplifier. The gate of transistor Q92 is coupled to the output of differential amplifier 906, the clamped VDDR voltage is provided at a source of the transistor, and the drain of the transistor is tied to ground. A holding capacitor C93 is attached between VDDR and ground. The clamped VDDR is also referred to as 'VDD' in the following section.

Figure 10:
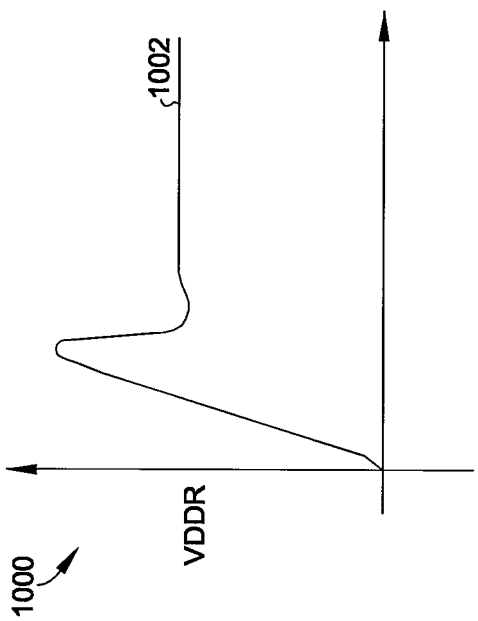
FIG. 10 is a timing diagram of an overshoot transient in the VDDR power supply for an RFID due to a slow clamping circuit according to the prior art.

Referring now to FIG. 10, the overshoot transient in the VDD clamped supply voltage is shown due to the undesirably slow response of a prior art clamping circuit. The power supply voltage waveform 1002 attains a desirably final VDD voltage level only after experiencing a significant overshoot that may adversely affect downstream circuitry.

Figure 11:
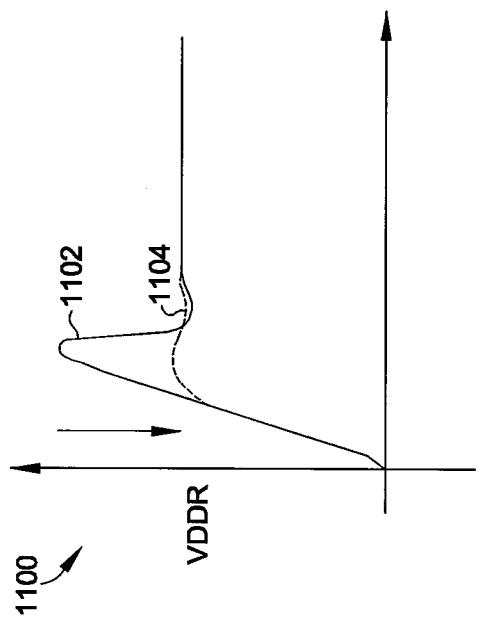
FIG. 11 is a timing diagram of the VDDR response to a fast RF rise with both active and dynamic clamping according to the present invention.

Referring now to FIG. 11, the prior art VDD voltage waveform 1102 including the undesirable overshoot is shown along with the VDD voltage waveform 1104 clamped with the active and dynamic clamping according to the present invention. Note that the voltage waveform 1104 has a much reduced overshoot.

Thus, a clamping method for an RFID tag according to the present invention includes providing a power supply voltage from an RFID rectifier having an overshoot in an unclamped condition, and clipping excess energy harvested by the RFID rectifier during an overshoot time period to prevent the overshoot and to prevent overdriving subsequent RFID circuitry. This method is provided by using a dynamic clamp in cascade with an active clamp. The dynamic clamp includes an NMOS transistor for shunting fast rising initial energy from the RFID rectifier output, and further includes a leakage path for turning off the NMOS transistor after the overshoot time period. Stated another way, a clamping method for an RFID tag according to the present invention includes removing energy harvested by an RFID rectifier from a fast rising RF field that would generate an overshoot condition for a predetermined initial time period to prevent overshoot and to prevent overdriving subsequent RFID circuitry.

Figure 12:
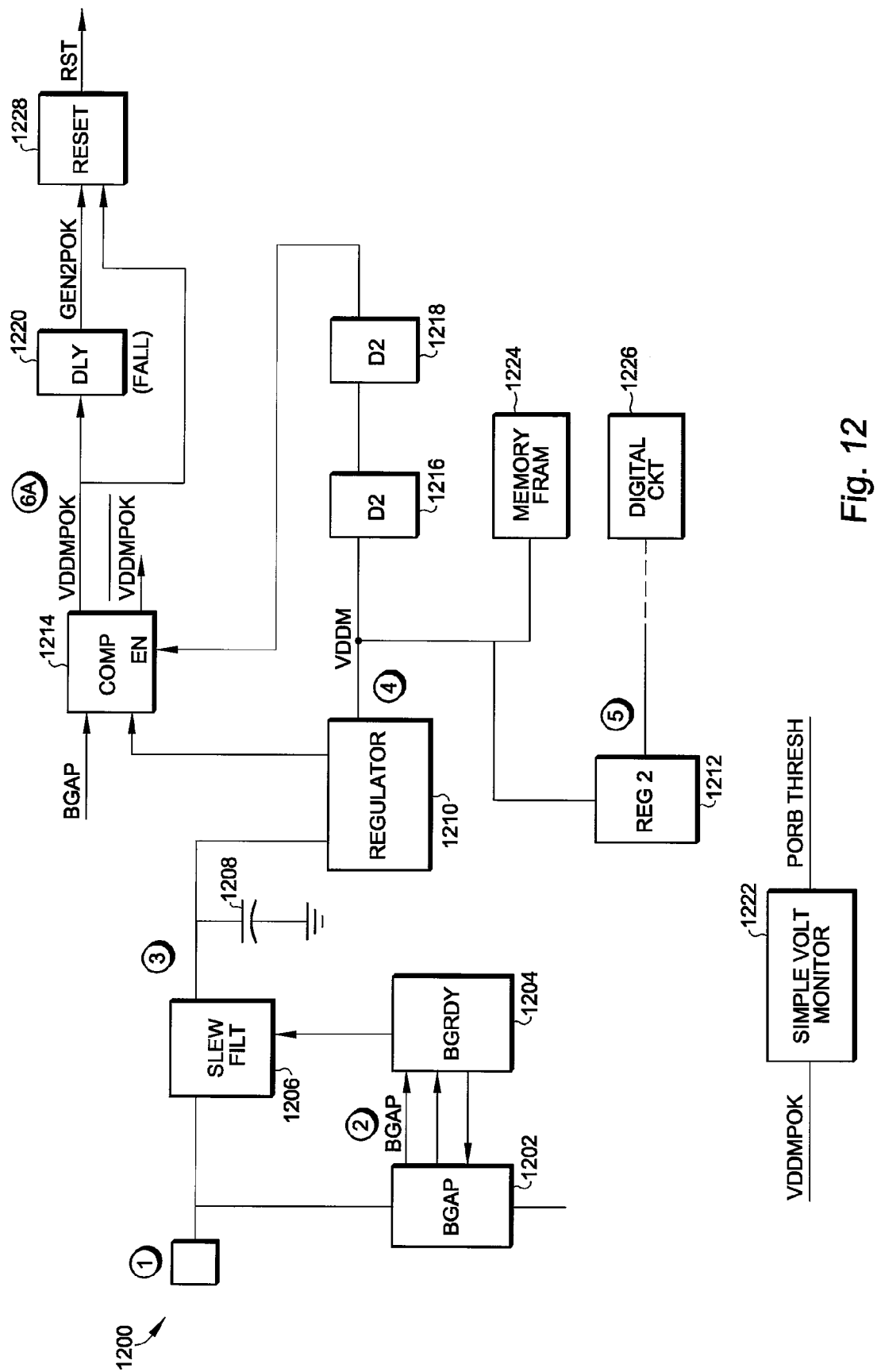
FIG. 12 is a schematic diagram of a power-on sequencing circuit for an RFID tag according to the present invention.

Referring now to FIG. 12, circuit 1200 provides sequencing control for an RFID tag according to the present invention. The voltage at input node (1) is the raw power supply voltage VDDR supplied by the dynamically and actively clamped output of the rectifier, Power VDDR in FIG. 2B. The circuit 1200 can be realized in a one-chip or two-chip solution. Circuit block 1202 is a normal bandgap circuit, coupled to the bandgap ready circuit 1204 at node (2). Bandgap ready circuit 1204 is explained in further detail below. Circuit block 1206 is a slew filter that is explained in further detail below. The output of the slew filter is shown as node (3), coupled to filter capacitor 1208. Circuit block 1210 is an LDO regulator generating power for the memory circuit block 1224, for the digital voltage regulator circuit block 1212. It also provides a divided down signal to circuit block 1214, a comparator, where it is compared to the bandgap voltage to generate signal VDDMPOK explained further below. The "memory VDDM" voltage means the VDD voltage provided to the memory. Note FRAM memory block 1224 is coupled to the VDDM line. Circuit block 1212 is a second regulator for providing the regulated VDDD voltage to the digital circuitry on the chip designated by block 1226 at node (5). Circuit block 1214 is a comparator. Three inputs are shown, which include a positive input, a negative input, and an enable input. The outputs of comparator 1214 are VDDMPOK, and the inverted VDDM-POK signals. The VDDMPOK signal node is labeled (6A). The VDDMPOK signal designation means "VDDM Power is OK". Blocks 1216 and 1218 are delay circuits that are explained in further detail below. Circuit block 1220 is also a delay circuit. Delay circuit 1220 can be a simple analog delay using a current source and a capacitor, and is used to generate the GEN2POK signal at node (6B) as shown. Block 1222 is a voltage monitor, and is described in further detail below. Finally, a reset signal generating block 1228 is shown for generating a reset signal at node 1808.

Figure 13:
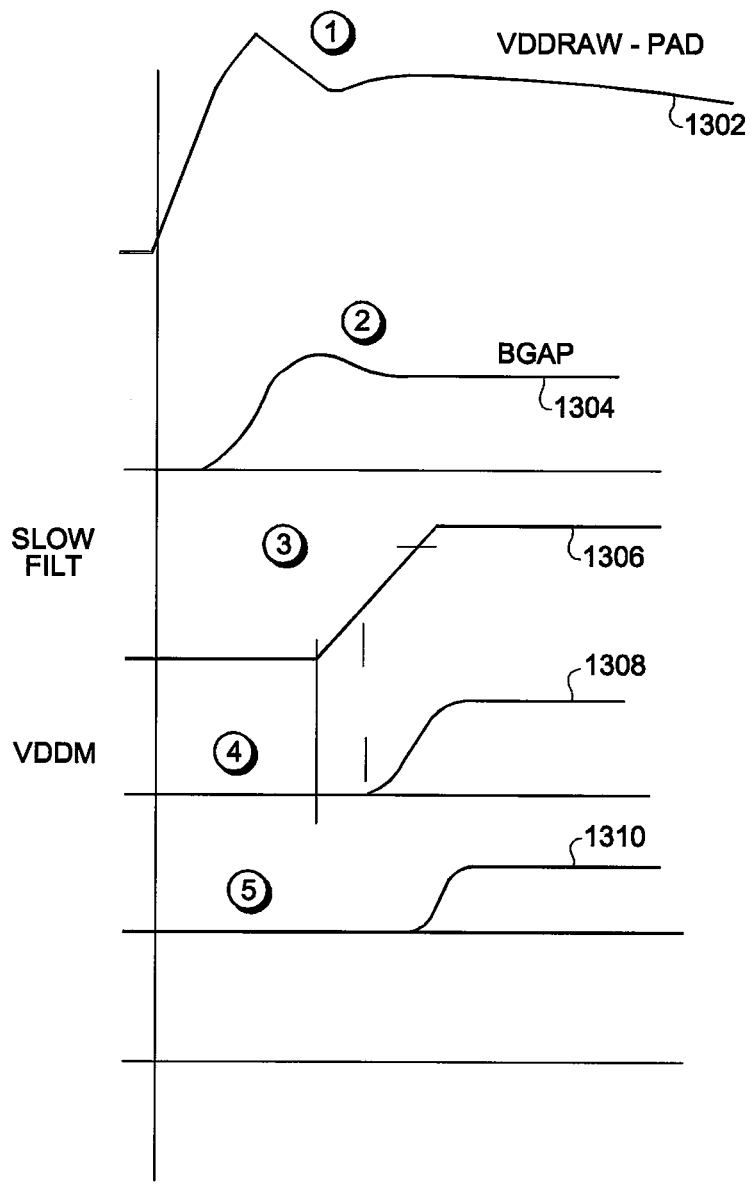
FIG. 13 is a timing diagram associated with the circuit of FIG. 12.

FIG. 13 is a timing diagram associated with FIG. 12, wherein the node waveforms for nodes (1), (2), (3), (4), and (5) are shown. The corresponding waveforms are designated 1302, 1304, 1306, 1308, and 1310. One of the most important functions associated with the circuit of FIG. 12 is to protect the FRAM memory from any loss of contents by shutting down the memory properly. That is, a new memory access is prevented when the memory voltage is below a certain value. Memory operation is only possible when VDDM is above a first threshold value, and maintains that value. Memory operation is discontinued when VDDM drops below a second threshold value.

Figure 14:
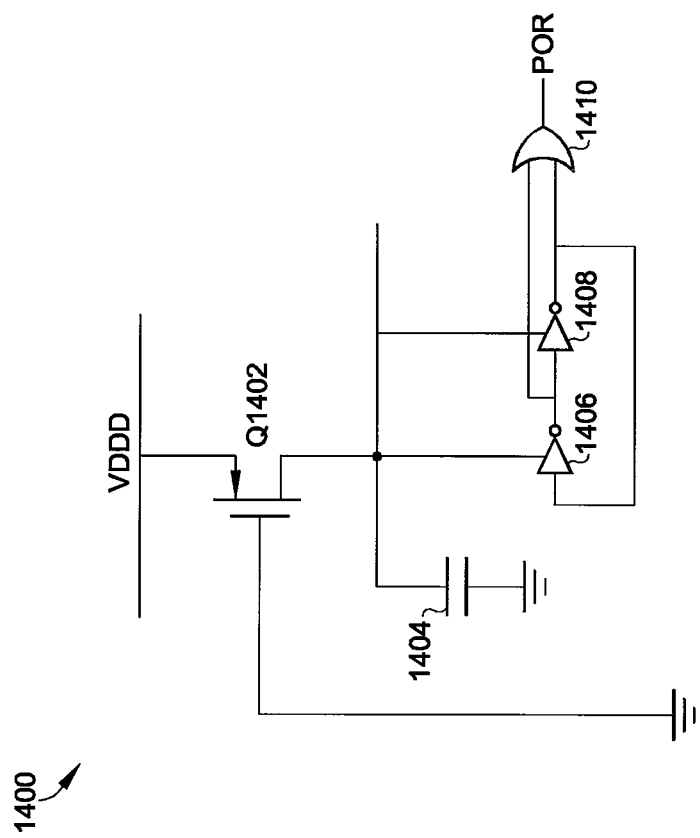
FIG. 14 is a schematic diagram of a power-on reset circuit according to the present invention.

Referring now to FIG. 14, a voltage monitor circuit is shown including a transistor Q1402, a capacitor 1404, and a digital circuit including inverters 1406 and 1408, and an OR gate 1410 for generating a POR signal.

Figure 15:
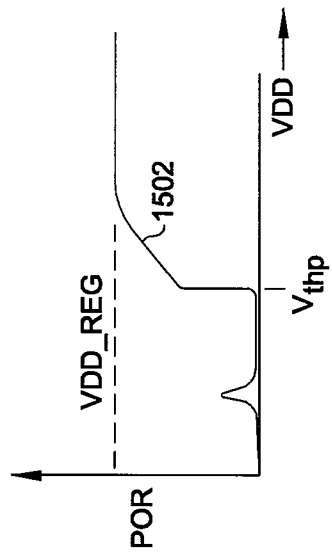
FIG. 15 is a timing diagram associated with the circuit of FIG. 14.

Referring now to FIG. 15, a waveform 1502 is shown that is associated with the monitor circuit of FIG. 14.

Figure 16:
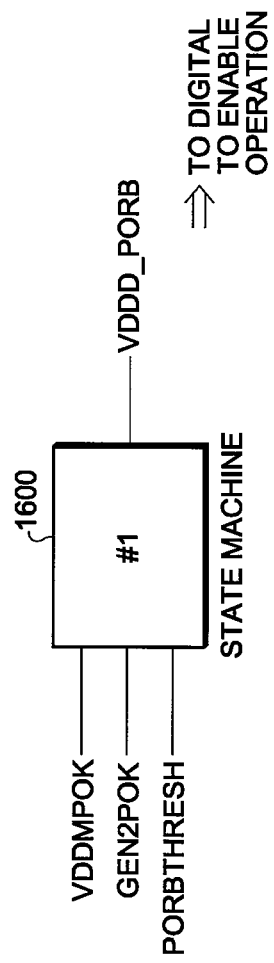
FIG. 16 is a block diagram of a state machine according to the present invention.

Referring now to FIG. 16, a state machine 1600 is shown that receives all of the various timing inputs and generates the VDDD_PORB signal. State machine 1600 operates according to the follow rules:

If PORB_THRESH is low, the output of the state machine is low.

If PORB_THRESH is high, then:

If the other two input signals are high, then the output is high.

If the other two input signals are low, then the output is low.

If only one of the two input signals are high, the output is high.

Figure 17:
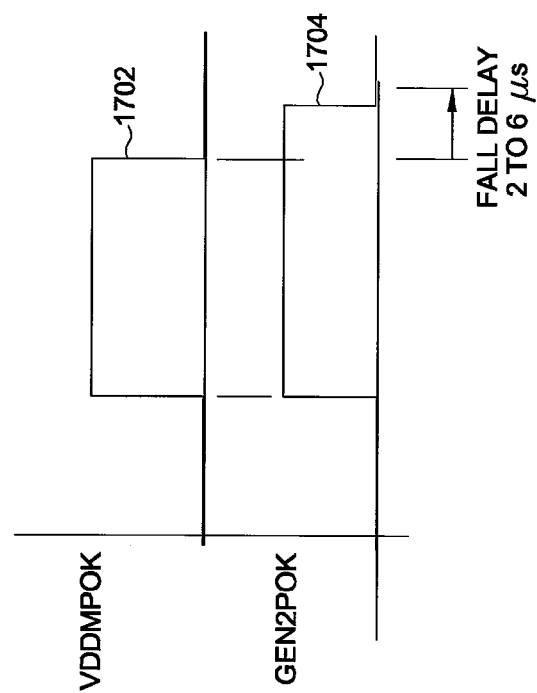
FIG. 17 is a timing diagram associated with the state machine of FIG. 16.

Referring now to FIG. 17, a timing diagram is shown associated with the state machine of FIG. 16. In particular, the fall edge delay with respect to the VDDMPOK signal 1702, and the GEN2POK signal 1704 is shown, which is in the range of about 2 to 6 microseconds.

Figure 18:
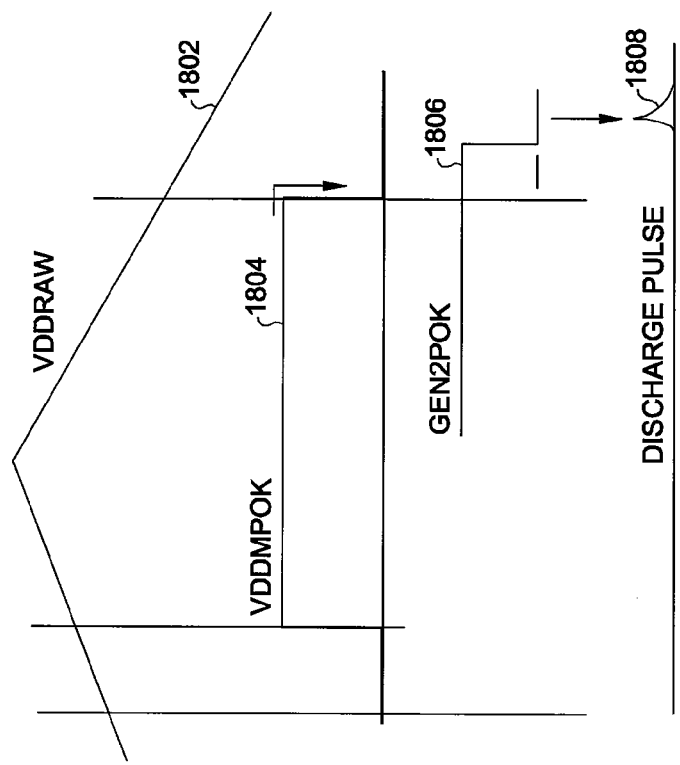
FIG. 18 is a timing diagram associated with the power-on reset circuit of FIG. 14.

Referring now to FIG. 18, a timing diagram associated with the overall sequencing circuit of FIG. 12 is shown including the input VDDRAW voltage, the VDDMPOK signal 1804, the GEN2POK signal 1806, and the discharge pulse 1808.

Figure 19:
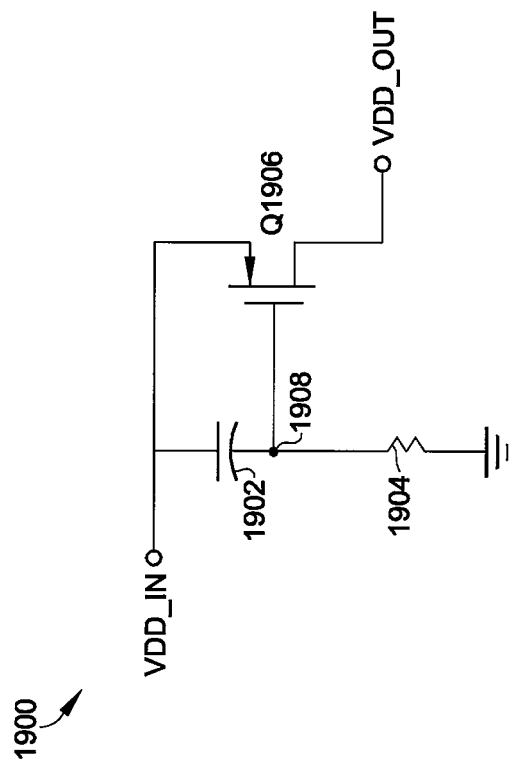
FIG. 19 is a schematic diagram of a first delay circuit embodiment for use with a power supply of an RFID tag according to the present invention.

Referring now to FIG. 19, a first delay circuit 1900 for use with a power supply in an RFID tag includes a power supply input VDD_IN and a power supply output VDD_OUT. A passive circuit 1902, 1904 is coupled between the power supply input VDD_IN and ground. A transistor Q1906 has a current path coupled between the power supply input VDD_IN and the power supply output VDD_OUT, and a control node coupled to an intermediate node 1908 of the passive circuit. The passive circuit includes a capacitor 1902 and a resistor 1904 in series connection. The capacitor 1902 is coupled between the power supply input VDD_IN and the intermediate node 1908. The resistor 1904 is coupled between the intermediate node 1908 and ground. Transistor Q1906 is a P-channel transistor.

Figure 20:
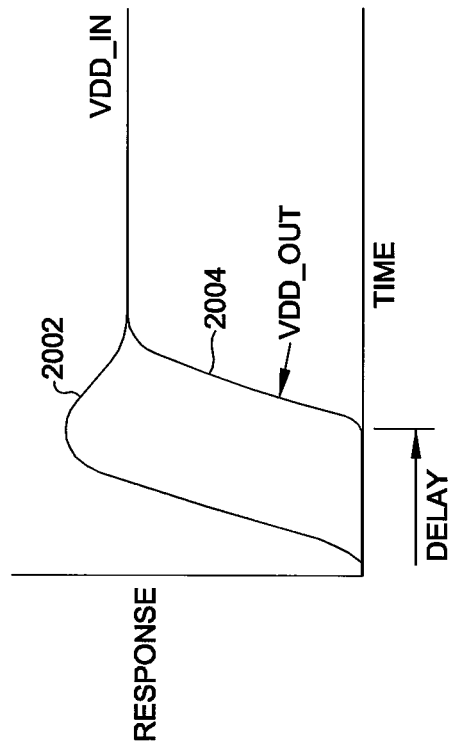
FIG. 20 is a timing diagram associated with the delay circuit of FIG. 19.

Referring now to FIG. 20, the response of the delay circuit 1900 is shown. The VDD_IN typically supplied by a diode rectifier on the RFID tag and has an overshoot indicated by waveform 2002. The VDD_OUT waveform 2004 after being processed by first delay circuit 1900 has no overshoot, and is delayed by a predetermined delay time period determined by the time constant of the passive circuit including capacitor 1902, resistor 1904.

Figure 21:
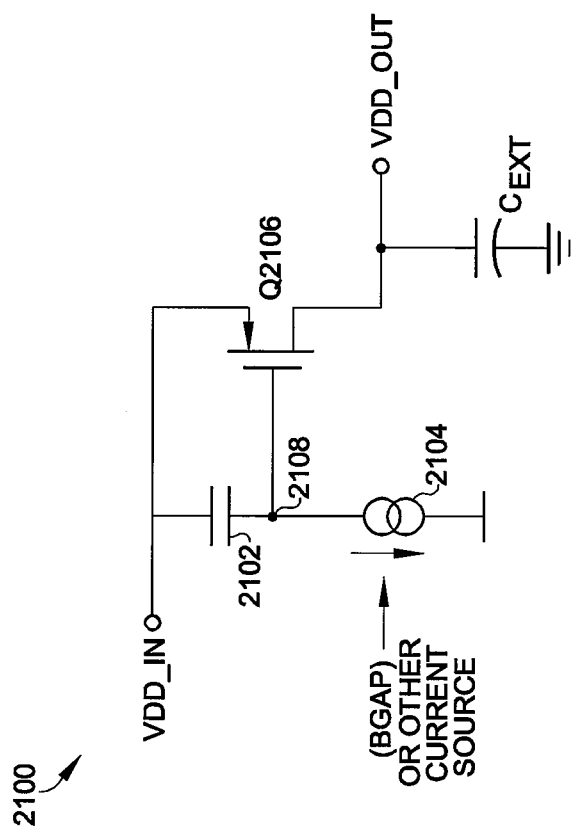
FIG. 21 is a schematic diagram of a second delay circuit embodiment for use with a power supply of an RFID tag according to the present invention.

Referring now to FIG. 21, a second delay circuit 2100 for use with a power supply in an RFID tag includes a power supply input VDD_IN and a power supply output VDD_OUT. A ramp circuit 2102, 2104 is coupled between the power supply input VDD_IN and ground. A transistor Q2106 has a current path coupled between the power supply input VDD_IN and the power supply output VDD_OUT, and a control node coupled to an intermediate node 2108 of the ramp circuit. The ramp circuit includes a capacitor 2102 and a current source 2104 in series connection. The current source can be a temperature stabilized current source provided from a bandgap circuit if desired. The capacitor 2102 is coupled between the power supply input VDD_IN and the intermediate node 2108. The current source 2104 is coupled between the intermediate node 2108 and ground. Transistor Q2106 is a P-channel transistor.

Figure 22:
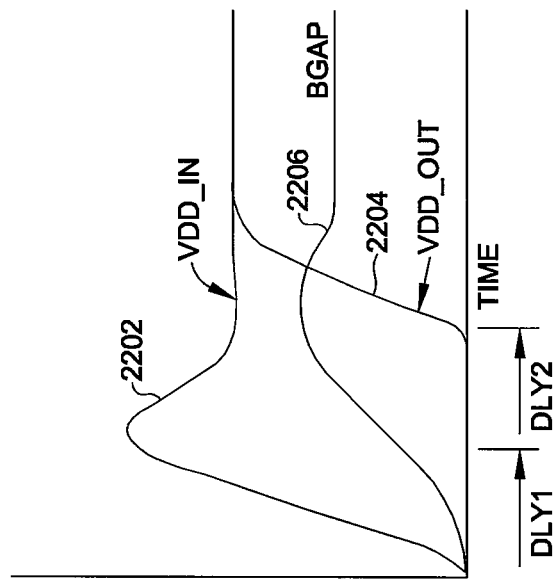
FIG. 22 is a timing diagram associated with the delay circuit of FIG. 21.

Referring now to FIG. 22, the response of the second delay circuit 2100 is shown. The VDD_IN typically supplied by a diode rectifier on the RFID tag and has an overshoot indicated by waveform 2202. The VDD_OUT waveform 2204 after being processed by second delay circuit 2100 has no overshoot, and is delayed by a predetermined delay time period determined by the ramping speed of the ramp circuit including capacitor 1902, resistor 1904. The predetermined delay time includes a first delay time DLY1, which is determined by the current source turning on and a second delay time DLY2, which is determined by transistor Q2106 turning on. The bandgap waveform 2206 is also shown in FIG. 22.

Figure 23:
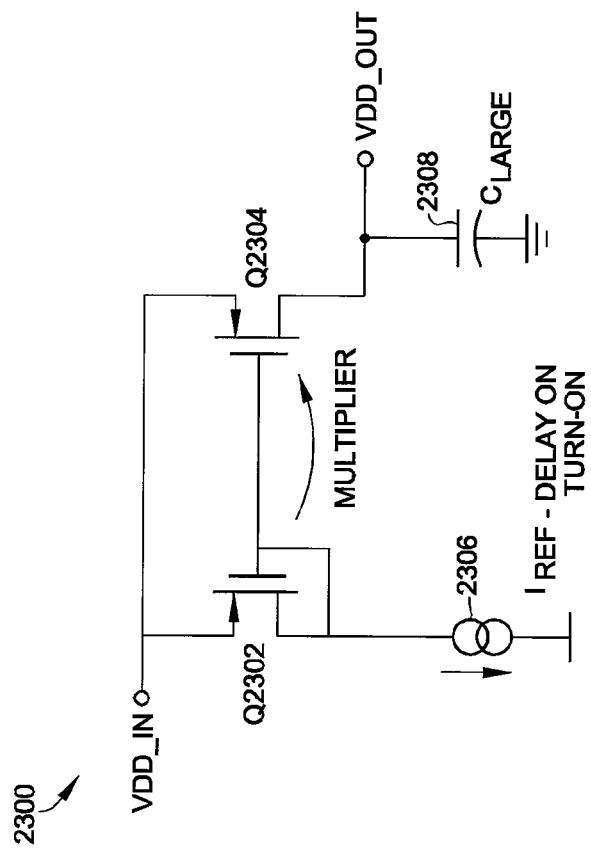
FIG. 23 is a schematic diagram of a third delay circuit embodiment for use with a power supply of an RFID tag according to the present invention.

Referring now to FIG. 23, a third delay circuit 2300 for use with a power supply in an RFID tag includes a power supply input VDD_IN and a power supply output VDD_OUT. A current mirror circuit Q2302, Q2304 has an input coupled to a current source 2306, an output coupled to the power supply output VDD_OUT, and a power node coupled to the power supply input VDD_IN. A capacitor 2308 ($C_{LARGE}$) is coupled between the power supply output VDD_OUT and ground. The current mirror circuit comprises a simple two-transistor current mirror with a P-channel MOS input transistor Q2302 and a P-channel MOS mirror transistor Q2304. Other more complicated current mirror circuits as are known in the art can also be used. Current source 2306 can be a temperature stabilized current source from bandgap circuit if desired.

Figure 24:
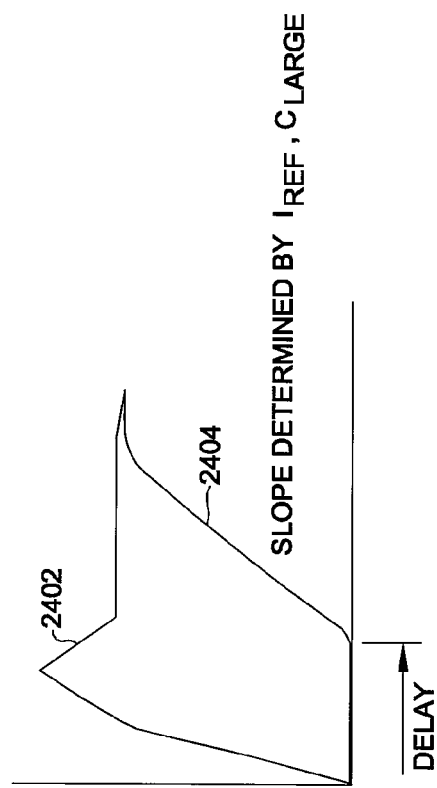
FIG. 24 is a timing diagram associated with the delay circuit of FIG. 23.

Referring now to FIG. 24, the response of the third delay circuit 2300 is shown. The VDD_IN typically supplied by a diode rectifier on the RFID tag and has an overshoot indicated by waveform 2402. The VDD_OUT waveform 2404 after being processed by first delay circuit 1900 has no overshoot, and is delayed by a predetermined delay time period determined by $I_{REF}$ turning on. The slew rate of the output waveform 2404 is defined by the values of the current source 2306 and the capacitor 2308 until a stable final output voltage value is reached.

Figure 25:
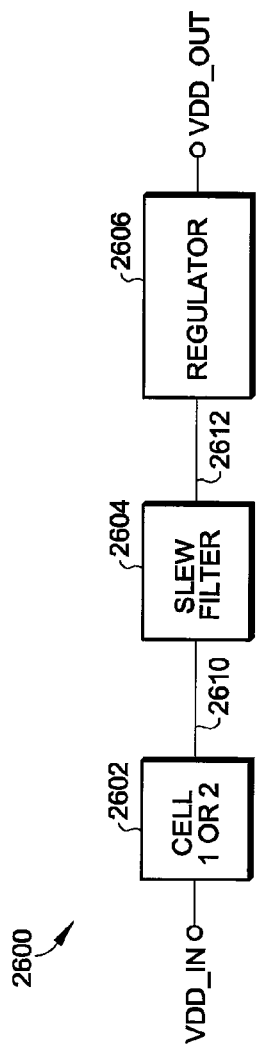
FIG. 25 is a schematic diagram of a cascaded delay circuit embodiment according to the present invention.

A cascaded delay circuit providing power to a regulator 2600 for an RFID tag is shown in FIG. 25 including a power supply input VDD_IN and a power supply output VDD_OUT and two delay circuits 2602, 2604 in cascade connection between the power supply input and the power supply output. Different combinations of cells and numbers can be used. For example, delay cell 2602 can be the delay cell 1900 shown in FIG. 19 or the delay cell 2100 shown in FIG. 21. The delay cell 2604 can be the slew filter 2300 shown in FIG. 23. The regulator 2606 can be any known voltage regulator such as an LDO, shunt, or source follower regulator.

Delay cell 2602 can comprise delay circuit 1900 or delay circuit 2100 as discussed above coupled between a local power supply input (VDD_IN) and a local power supply output 2610.

Slew filter 2604 can comprise delay circuit 2300 as discussed above coupled between a local power supply input 2610 and a local power supply output 2612.

Voltage regulator 2606 can comprise any known voltage regulator as discussed above coupled between a local power supply input 2612 and a local power supply output VDD_OUT.

Figure 26:
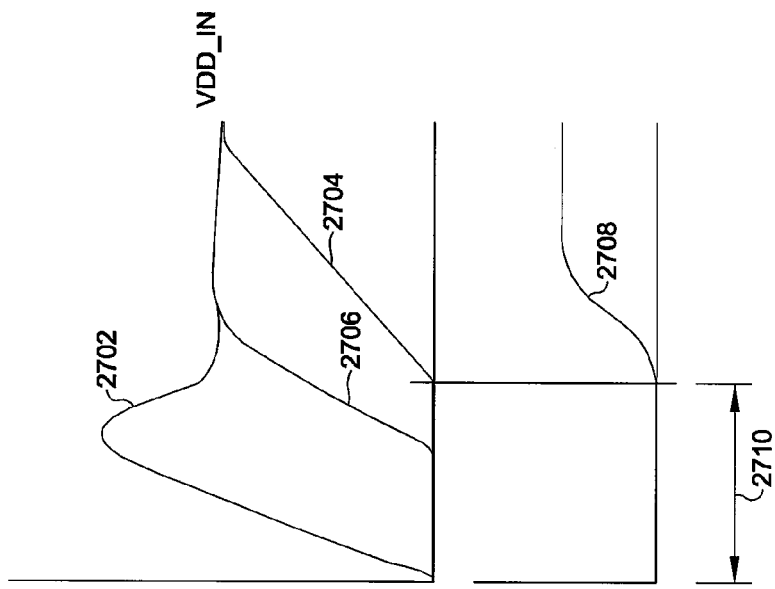
FIG. 26 is a timing diagram associated with the cascaded delay circuit of FIG. 26.

Referring now to FIG. 26, a number of response waveforms are shown in the timing diagram associated with circuit 2600 in FIG. 25. The VDD_IN waveform 2702 is shown having an overshoot. The output of the first delay cell 2706 is shown slightly delayed and having no overshoot. The output of the slew filter 2704 is shown still further delayed and having a slew-controlled output up to a final stable voltage output. This output is still further delayed and regulated by the voltage regulator as shown in waveform 2708. The total delay 2710 is shown between the onset of the VDD_IN waveform and the start of the VDD_OUT regulated output voltage.

The purpose of the various single and cascaded power supply delay circuits is to provide a control mechanism for turning on circuit blocks and functions inside of an RFID tag only when it can be assured that a stable power supply voltage can be provided. It will be apparent to those skilled in the art that the cascaded delay circuit 2600 can be designed with other arrangements of delay cells while still providing the desirable stable voltage function.

Figure 27:
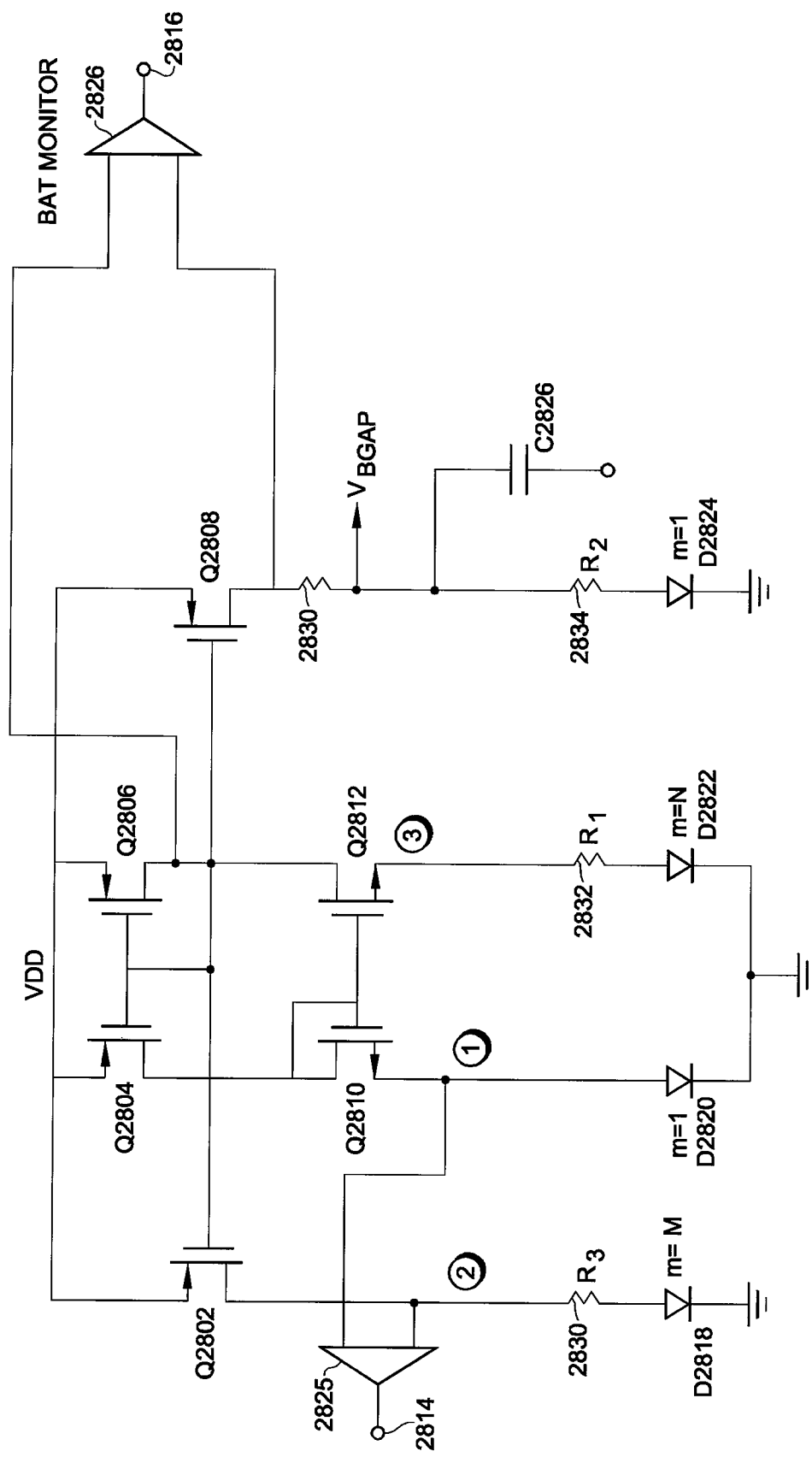
FIG. 27 is a schematic diagram of a bandgap ready circuit according to the present invention.

Referring to FIG. 27, a circuit for detecting the safe voltage operation for a chip such as found in an RFID tag, it is necessary to first detect when the system reference level, derived from a bandgap voltage generator, is sufficiently stable so that signals generated from this reference will be in a range near steady state operation. A regulator that has a bandgap reference generates a voltage proportional to the reference. If the reference is not fully settled, the regulator output is not in its design range. The bandgap circuit operates by feedback control to maintain operation at a crossing point of two node voltages, nodes 1 and 2. According to the present invention, a third branch that crosses one of the nodes during the turn-on transient and is at a higher steady state voltage, at a lower than final operational voltage is used to generate a voltage that is compared with one of the bandgap reference voltages, node 1, to create part of a bandgap ready logic signal. However, when addressing input transients, slow and erratic power supplies, an additional problem was identified. The branch transients are not well controlled and an erroneous valid operation was predicted. To fix this secondary problem, an additional monitoring circuit was added to detect saturation operation of the core branch of currents in the bandgap voltage generator that would be combined with the crossing information logic signal to more reliably predict when the bandgap reference cell was close to steady state operation. Once the band gap reference cell is at steady state operation valid comparisons of regulator outputs for signaling to control circuits that the proper state of the power supply has been reached.

In the bandgap ready circuit 2800 of FIG. 27, levels that are monitored for control of operations only at a defined range rely on having a reference that is at or close to the end of its turn-on transient. Once a reference valid monitor for the bandgap reference cell is generated, false release of operation of the RFID chip at voltage levels that are too low for reliable operation is substantially obviated.

Bandgap circuits are well known in the art. It is also well known that voltage regulation such as is required in a chip in an RFID tag requires a stable bandgap reference voltage. During power up, monitor circuits used in the power-up sequence will undesirably glitch if the reference is not yet stable and may improperly release circuit functions when supplies are out of operational range. Prior art uses timing delays to allow the bandgap reference circuit to settle before indicating that a stable operating voltage has been reached. While the approach according to the present invention is effective for assuring that a proper operating voltage has been reached, and then other circuit function can begin, it is process sensitive and should be tuned to ensure optimum performance.

Referring to FIG. 27, a 'bandgap ready' circuit 2800 includes a bandgap circuit for providing a bandgap voltage including diodes D2820, D2822, resistor R1 designated 2832, N-channel transistors Q2810 and Q2812, and P-channel transistors Q2804 and Q2806. Transistors Q2810 and Q2812 form an N-channel current mirror. Transistors Q2804 and Q2806 form a P-channel current mirror. Other bandgap designs would have equivalent monitoring nodes from this example design. P-channel transistor Q2808 is mirrored from the P-channel current mirror. The drain current from transistor Q2808 is used to generate the $V_{BGAP}$ voltage across diode resistor R2 designated 2834 and diode D2824. A capacitor C2826 is coupled to the bandgap output voltage node. A first comparator 2828 is used for monitoring first and second voltages in the bandgap circuit and for providing a first logic signal at node 2814. A first input is coupled to the source of transistor Q2810 and a second input is coupled to the drain of P-channel transistor Q2802 in a replica branch. The current through transistor Q2802 generates a slightly larger and tracking voltage to node 2 in the bandgap core, across resistor R3 designated 2830 and diode D2818. A second comparator 2826 is used for monitoring third and fourth voltages in the bandgap circuit and for providing a second logic signal at node 2816. A first input is coupled to the drain of transistor Q2806 and a second input is coupled to the drain of transistor Q2808, which is also coupled to resistor R2830, as shown.

In circuit 2800 shown in FIG. 27, the relative sizes of the diodes for proper generation of the bandgap voltage are given as follows: D2818, m=M; D2820, m=1; D2822, m=N; and D2824, m=1.

Figure 28:
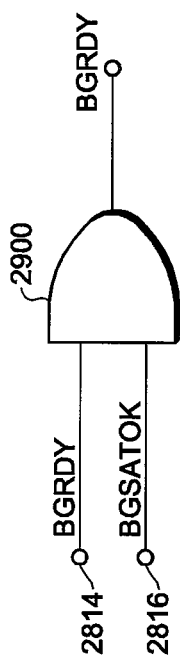
FIG. 28 is a schematic diagram of a logic circuit for use with the bandgap ready circuit of FIG. 27.

Referring now to FIG. 28, an AND logic circuit 2900 for combining the first and second logic signals at nodes 2814 and 2816 is used to provide a bandgap ready logic signal BGOK.

Figure 29:
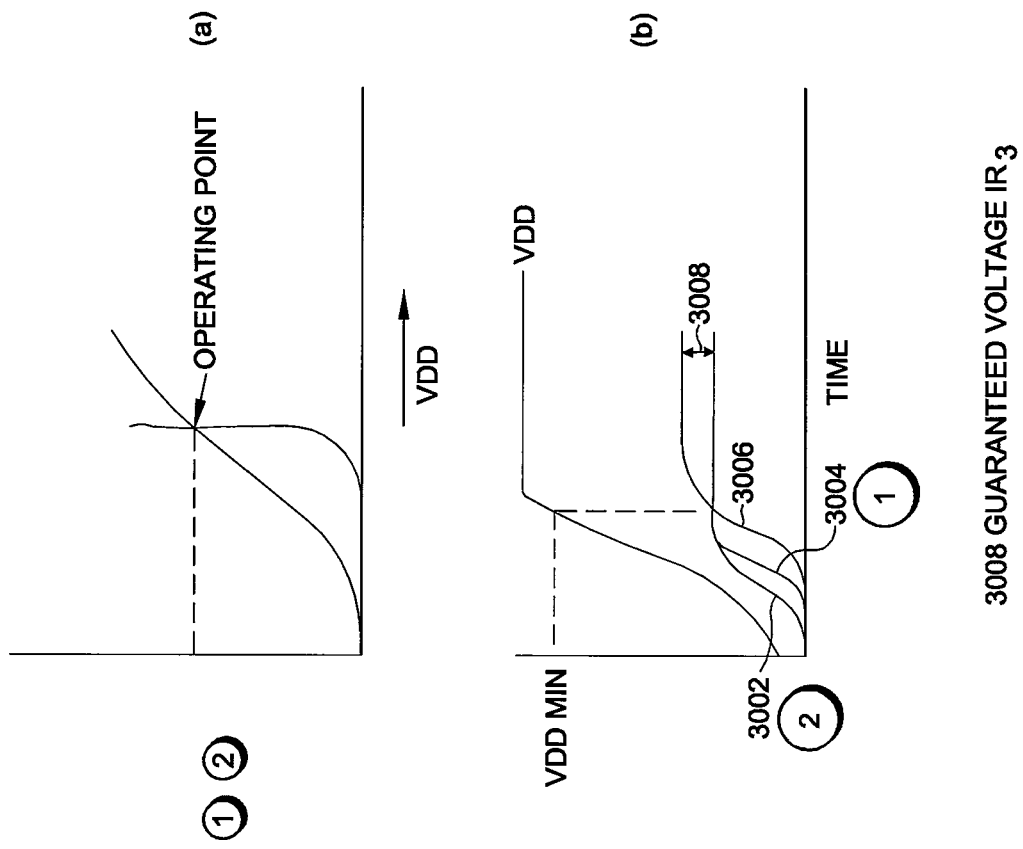
FIG. 29 is a timing diagram associated with the bandgap ready circuit of the present invention.

Referring now to FIG. 29(*a*) a graph of the voltages at the source of transistor Q2810 and drain of transistor Q2802 are shown, designated nodes (1) and (3006) in FIG. 27. The crossover point of these two voltages is used to generate the first logic signal at node 2814. The comparison is not done directly on core nodes, but rather through the replica branch provided by transistor Q2802, resistor R3 designated 2830, and diode D2818 as discussed above. In FIG. 29(*b*) the VDD supply voltage is shown crossing a minimum allowable operational threshold with respect to time. Waveform 3002 represents the voltage at node (3), waveform 3004 represents the voltage at node (1), waveform 3006 represents the voltage at the top of resistor R3 at node (2), and voltage difference 3008 represents a guaranteed crossing voltage difference due to steady state core current I multiplied by R3.

Figure 30:
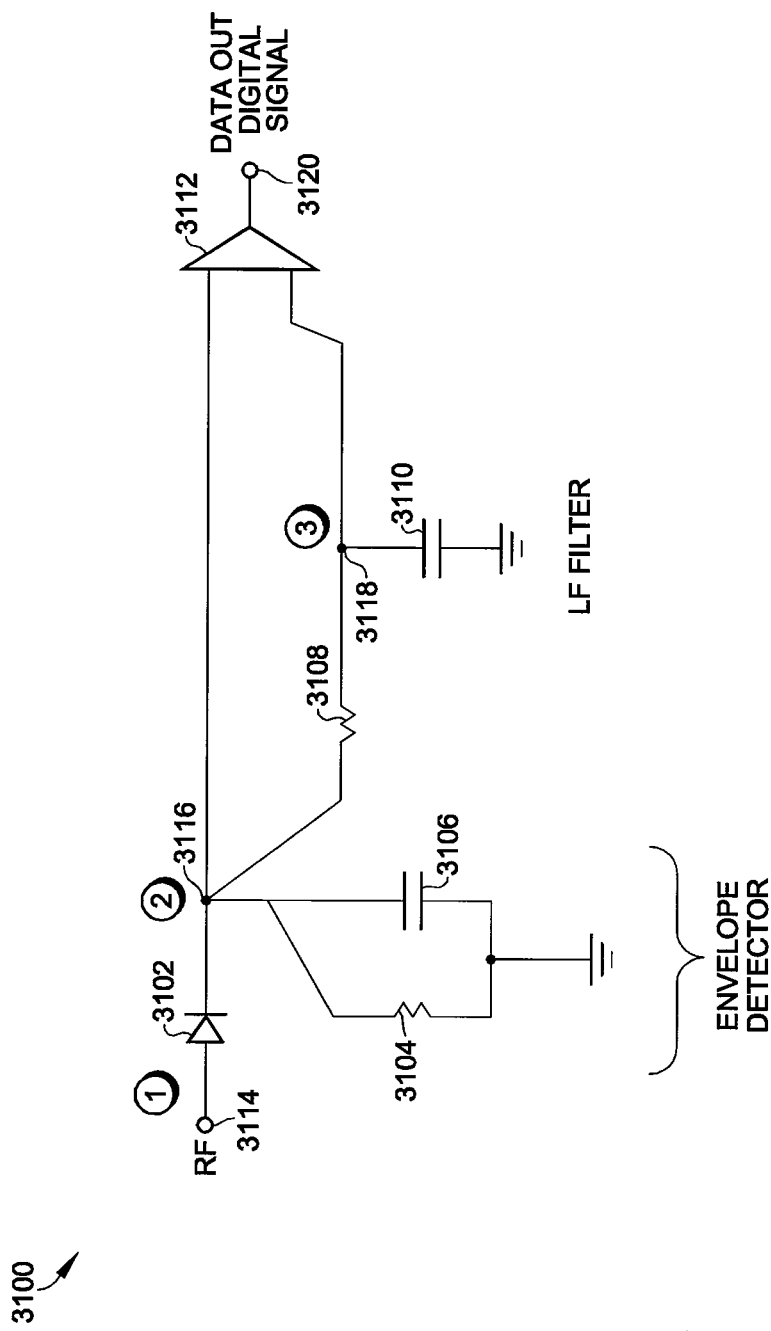
FIG. 30 is a schematic diagram of a prior art demodulation circuit.

Referring now to FIG. 30, a prior art demodulation circuit 3100 is shown including an RF input at node 3114, an input diode 3102 coupled between input node 3114 and node 3116. A resistor 3104 in parallel with capacitor 3106 is coupled to node 3116. Diode 3102, resistor 3104, and capacitor 3106 form an envelope detector as is known in the art. The signal at node 3116 is filtered by a low pass filter including resistor 3108 and capacitor 3110. The output of the low pass filter at node 3118, and the envelope signal at node 3116 are received by a comparator 3112 to provide a data output digital signal at output node 3120.

Figure 32:
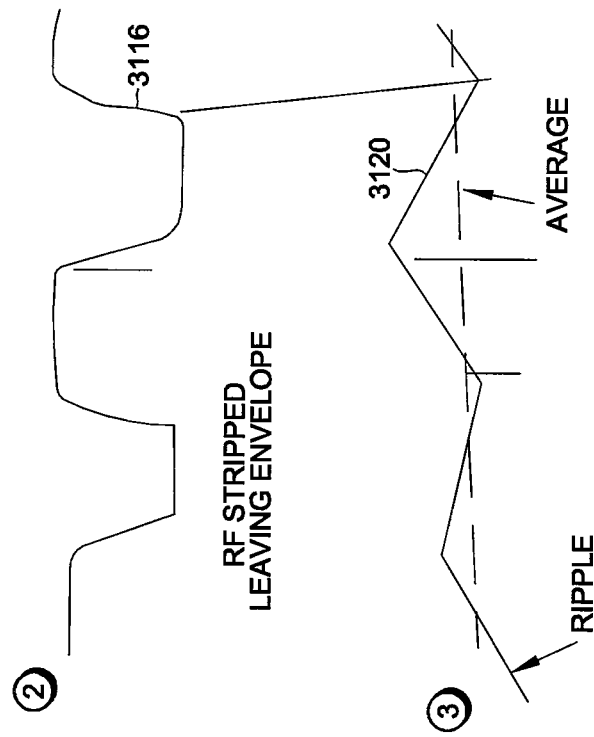
FIG. 32 is a timing diagram associated with the prior art demodulation circuit of FIG. 30.
Figure 31:
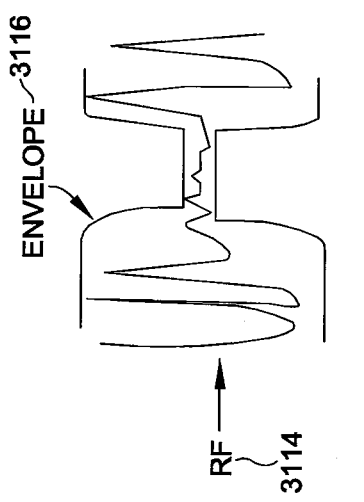
FIG. 31 is a timing diagram associated with the prior art demodulation circuit of FIG. 30.

Referring now to FIG. 31, a timing diagram is shown including the RF waveform 3114 and the envelope waveform 3116. The timing diagram of FIG. 32 shows the envelope waveform 3116, as well as the output waveform showing the desirable average value and the undesirable ripple that is produced due to the averaging circuit 3100.

Prior art RFID demodulation circuits such as those described above may not provide proper operation over all input power levels due to large input signals at high power. Averaging schemes to correct this problem are problematic because they are data rate dependent, leading to a variation in pulse widths during the averaging transient. To correct this problem, a fixed reference was added where the power level reduction in operating margin was detected. An additional signal dependent current was added to the reference voltage so that higher power levels generated their own higher level reference as is explained in further detail below.

Transient pulse width changes with averaging circuits corrupt data detection. With existing averaging circuits a single filter time constant is not sufficient for both low and high data rates. At high data rates the ripple signal on the average is low, but there is a long transient during which the duty cycle changes. At low data rates the ripple signal is large and can cross the detection threshold depending on input power level. Both of these extremes can see errors in data detection during startup conditions.

Figure 33:
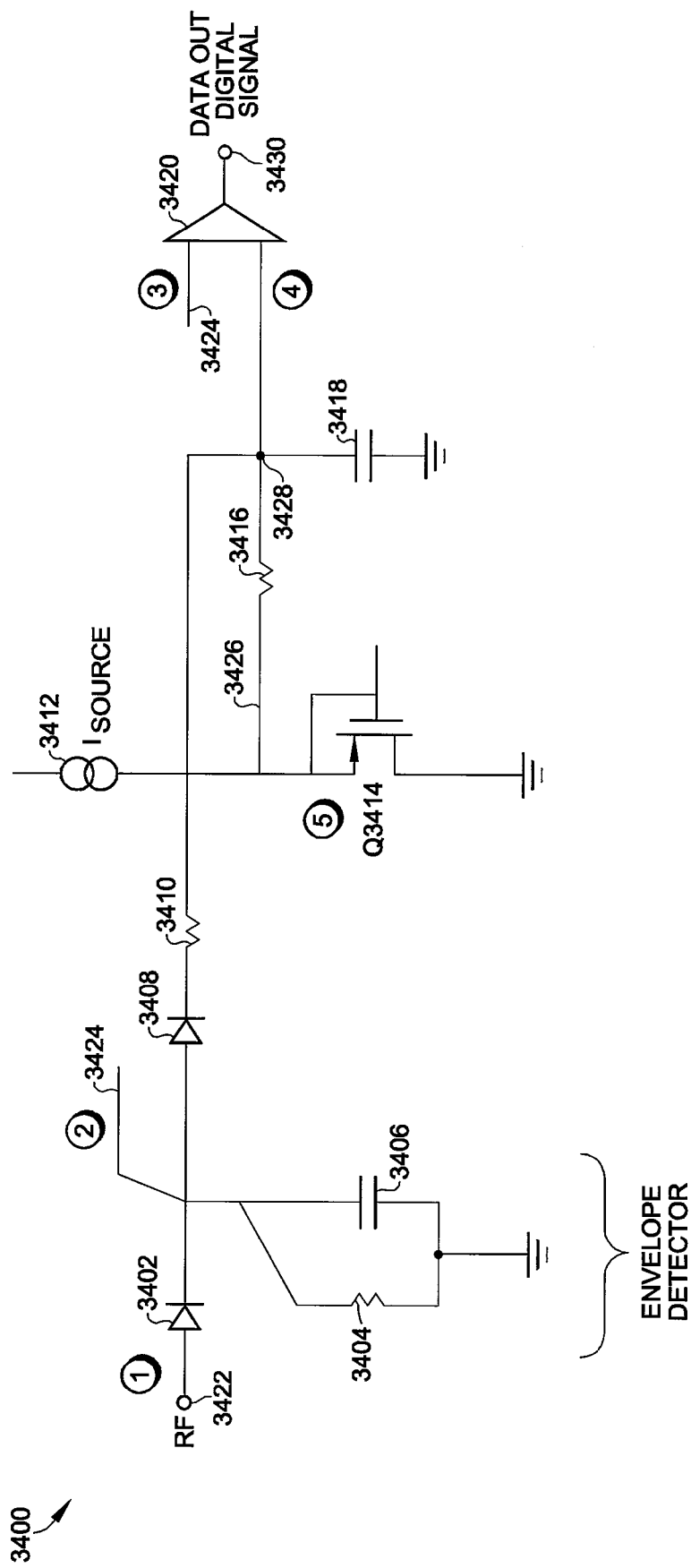
FIG. 33 is a schematic diagram of a dynamic adjusting RFID demodulation circuit according to the present invention.

Referring now to FIG. 33, a dynamic adjusting RFID demodulation circuit 3400 is shown according to the present invention. Dynamic adjusting RFID demodulator circuit 3400 includes an envelope detector 3402, 3404, 3406 having an input for receiving a modulated RF signal at node 3422, a fixed reference 3412, Q3414 coupled to the input of an RC filter 3416, 3418 and a comparator 3420 having a first input coupled to the output of the envelope detector, a second input coupled to an output of the RC filter, and an output for providing a data output signal at node 3430. The envelope detector includes an input diode 3402, parallel resistor 3404 and capacitor 3406, as well as an output diode 3408 and an output resistor 3410. The fixed reference includes a current source 3412, which can be a thermally compensated current source derived from a bandgap circuit, and a diode-connected N-channel transistor Q3414. Other fixed references can be used. The RC filter includes a resistor 3416 and a capacitor 3418. The first input of the comparator 3424 is a positive input and the second input is a negative input in a preferred embodiment.

Demodulator circuit 3400 of the present invention thus includes a fixed reference generated by a current source (from a bandgap circuit if desired) and a diode-connected MOS transistor and an RC filter plus another energy path activated at higher power levels that inject current into the output of the RC filter at the input to the comparator. The threshold of the comparator is thus augmented proportionally to the input power so that high power and low power RF input signals are equally discriminated.

Referring now to FIGS. 34-36, various circuit waveforms are shown that illustrate the dynamic threshold of circuit 3400 responding to different input levels. In FIG. 34, two RF envelopes are shown. A first RF envelope 3424A is shown at low power levels. A second RF envelope 3424B is shown at relatively higher power levels. The threshold voltage for comparator 3420 at low power levels is the same at both nodes 3426 and 3428. However, as is shown in FIG. 35, the voltage levels at nodes 3426 and 3428 are different at higher power levels. That is, the voltage at node 3428 is greater than that at node 3426 at higher power levels. Finally, in FIG. 36, the voltage at node 3428 is shown with respect to increasing RF input power levels. The voltage at node 3428 begins at a first level and increases as the input power is increased.

Figure 37A:
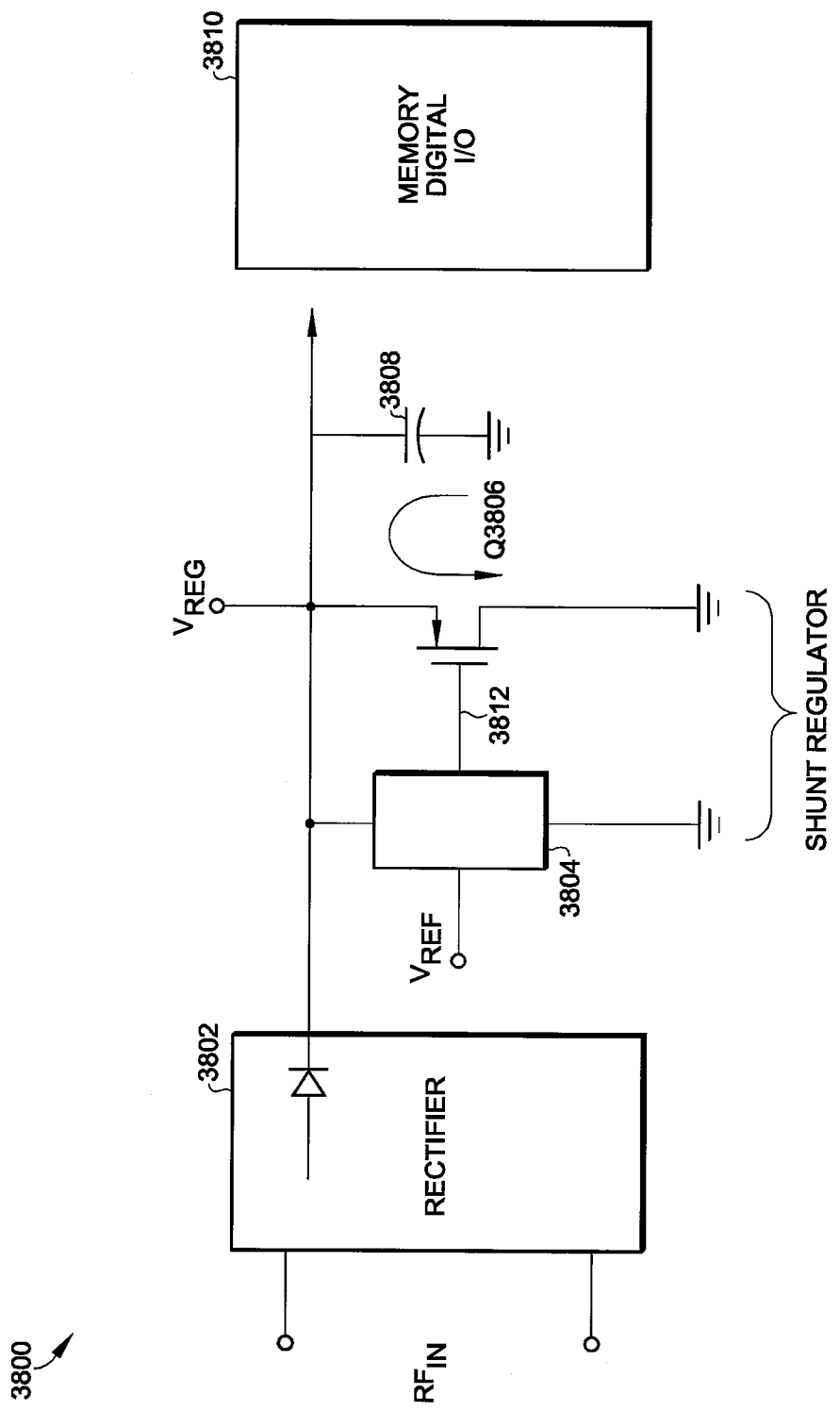
FIGS. 37A and 37B are schematic diagrams of a prior art shunt regulator.

Referring now to FIG. 37A, a schematic diagram of a prior art shunt voltage regulator 3800 is shown in the context of an RFID tag application. A rectifier 3802 receives an RF input signal, which is rectified to provide a supply voltage, which is the same voltage node that is regulated, $V_{REG}$, as is known for a shunt regulator. A resistor divider circuit and comparator 3804 are coupled between $V_{REG}$ and ground. The resistor divider circuit and comparator receive an input reference voltage and provide a control voltage at node 3812 for a discharge device. A P-channel discharge device shown here for example, transistor Q3806 has a source coupled to the $V_{REG}$ node, a gate for receiving the control voltage at node 3812, and a drain coupled to ground. The $V_{REG}$ is coupled to a large holding capacitor 3808, which provides a stable voltage and energy for powering on-chip circuits such as a FRAM memory circuit, various digital and analog circuits, and I/O circuits.

Figure 37B:
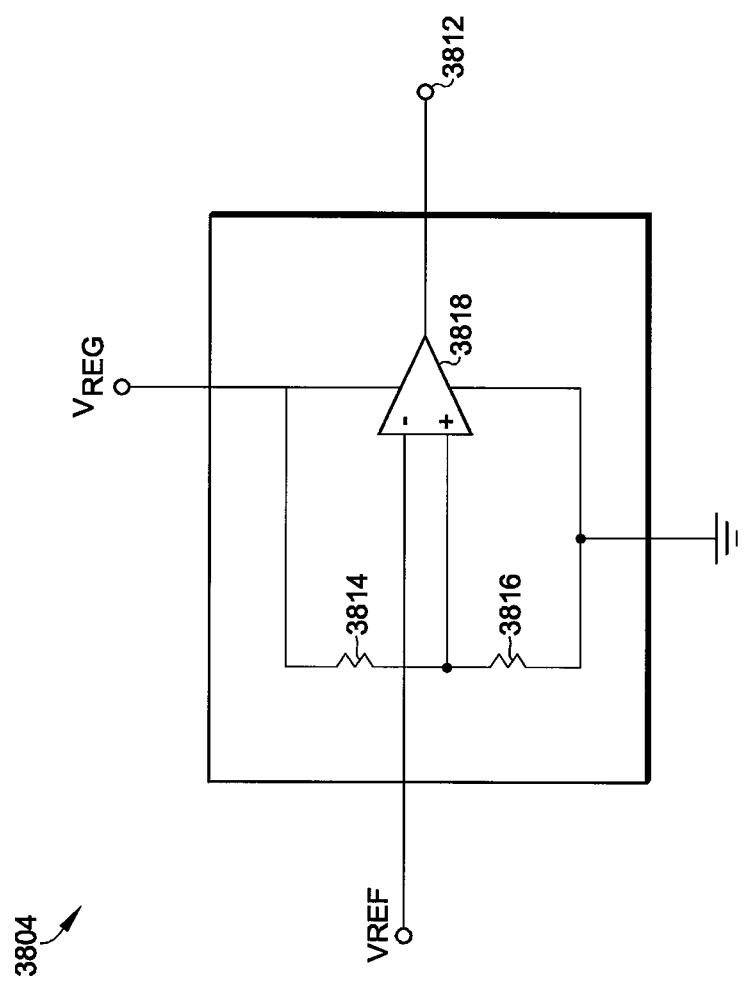

The resistor divider circuit and comparator 3804 are shown in further detail in FIG. 37B, wherein a resistor divider including resistors 3814 and 3816 is coupled between the $V_{REG}$ and ground. An amplifier 3818 receives the input reference voltage at a first input (negative) and a tap voltage of the resistor divider at a second input (positive). The output voltage of the amplifier 3818 provides the control voltage for the P-channel transistor Q3806 at node 3812 as shown.

The holding capacitor 3808 is effectively the on-chip power supply voltage for the rest of the integrated circuit, or circuits in an RFID tag. The voltage on the capacitor 3808 is from charge harvested from an RF reader. It is important that this charge be conserved and not wasted during any regulation operations.

Figure 38:
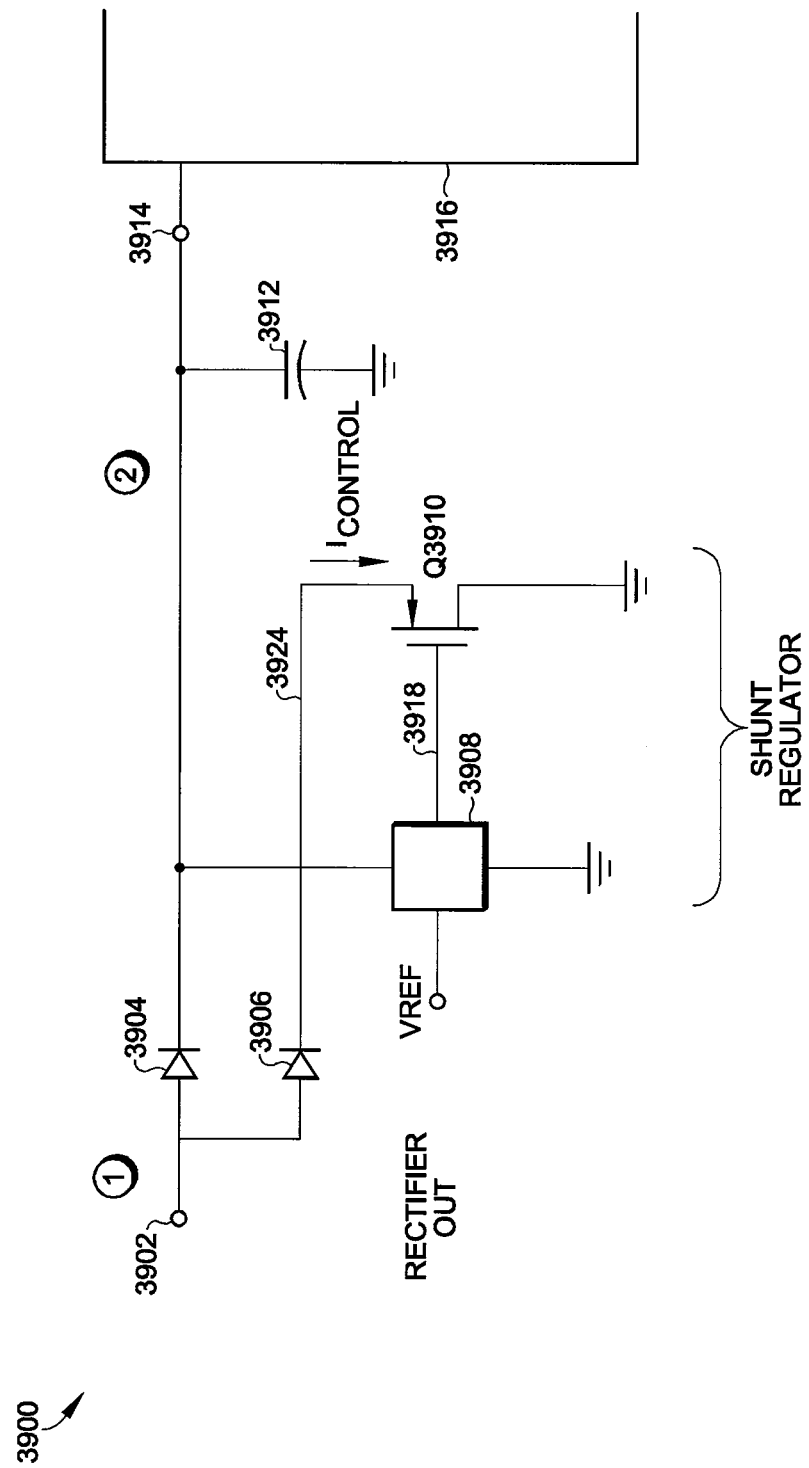
FIG. 38 is a schematic diagram of a shunt regulator driven from a rectifier circuit output having a split output according to the present invention.

Referring now to FIG. 38, a shunt regulator 3900 for an RFID tag chip according to the present invention is shown having a split source output from the RF rectifier including a first output 3914 for providing a power delivery path to on-chip circuits 3916 and a second output 3924 for providing a discharge-regulation path. As previously discussed, the on-chip circuits can include a FRAM memory circuit, I/O circuits, and other digital and analog circuitry as required for a specific application. A large holding capacitor 3912 is coupled between the first output 3914 and ground. The shunt regulator 3900 includes an input node 3902 for receiving a power supply voltage from a rectifier output, a first diode 3904 having an anode coupled to the input node, a second diode 3906 having an anode coupled to the input node, a resistor divider circuit and comparator 3908 coupled between a cathode of the first diode and ground, a P-channel transistor 3910 having a control terminal coupled to an output of the resistor divider circuit and comparator at node 3918, and a current path coupled between a cathode of the second diode and ground, wherein the cathode of the first diode forms the first output 3914 and the cathode of the second diode forms the second output 3924.

The resistor divider and comparator circuit 3908 are substantially the same as is shown in FIG. 37B.

Figure 39:
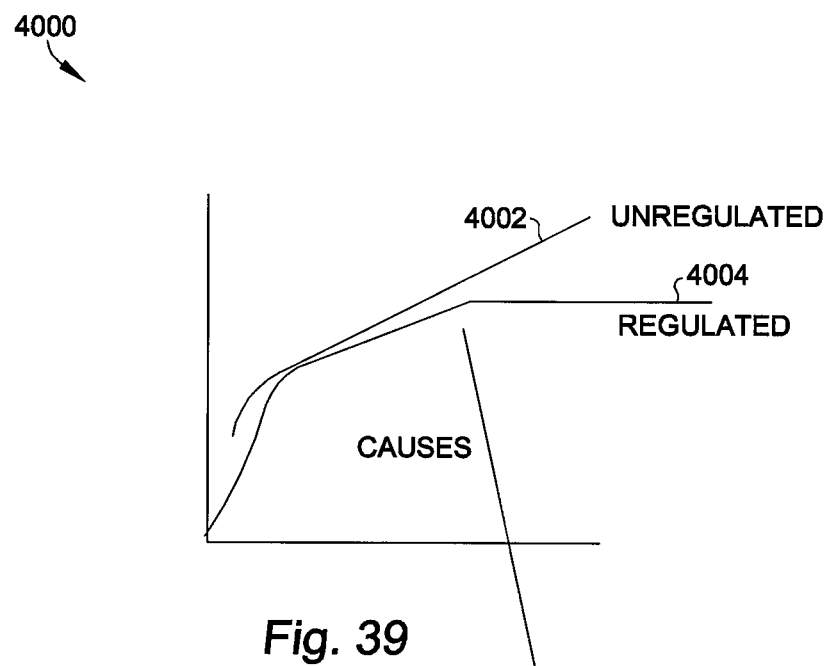
FIGS. 39 and 40 are timing diagrams associated with the shunt regulator of FIG. 38.

Referring now to FIG. 39 a plot 4000 is shown of the unregulated voltage waveform 4002 and the regulated voltage waveform 4004 with respect to ground.

The input unregulated voltage 4002, which exceeds a desirable upper value, is shown to be regulated to a constant acceptable upper value in the regulated voltage 4004. Note that current ICONTROL, shown in FIG. 38 pulls down node 3902, isolating node 3914 in the presence of excess RF energy.

Figure 40:
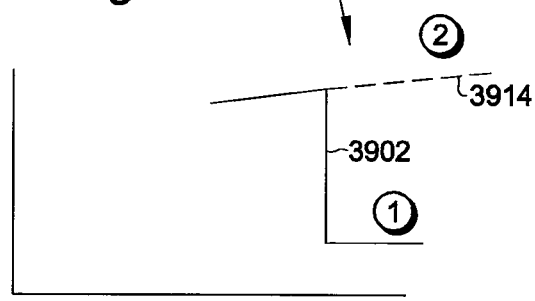

Referring to FIG. 40, the input voltage from the rectifier at node 3902 is plotted in juxtaposition with the output voltage at the first output node 3914 with the shunt regulator crossing into regulation. An overvoltage condition results in activation of Q3910 in FIG. 39 dumping excess harvested energy and pulling down node 3902 and isolating 3914 and not discharging capacitor 3912. Note that in the case of a voltage drop-out due to loss of contact with the RF reader, the input voltage also drops; however, the on-chip power supply voltage at node 3914 remains high momentarily, and the extra charge is conserved and can be continued to be used for powering on-chip circuits. With the separation of the discharge-regulation path from the power delivery path regulation can be maintained while not removing the charge from the hold capacitor 3912 that powers the rest of the circuitry. Separating the outputs according to the present invention as described makes the RFID tag more efficient.

It will be apparent to those skilled in the art that various modifications and variations can be made in the present invention without departing from the spirit or scope of the invention. As would be apparent to those skilled in the art, equivalent embodiments of the present invention can be realized in firmware, software, or hardware, or any possible combination thereof. In addition, although representative block diagrams are shown for an aid in understanding the invention, the exact boundaries of the blocks may be changed and combined or separated out as desired for a particular application or implementation. Finally, although FRAM memory is described and claimed, the present invention is also applicable to any other high speed non-volatile memory technology. Thus, it is intended that the present invention cover the modifications and variations of this invention provided they come within the scope of the appended claims and their equivalents.

What is claimed is:

1. A method of operating a dynamic adjusting RFID demodulator circuit comprising:
    providing an envelope detector and an RC filter coupled to the envelope detector;
    increasing a threshold of the RFID demodulator circuit in response to the power of an input modulated RF signal; and
    comparing an output of the envelope detector to an output of the RC filter to provide a data output signal.

2. A dynamic adjusting RFID demodulator circuit comprising:
    an envelope detector and an RC filter coupled to the envelope detector
    a comparator having a first input coupled to an output of the envelope detector, a second input coupled to an output of the RC filter and an output for providing a data output signal,
    wherein the comparator has a threshold corresponding to the power of an input modulated RF signal.

3. A dynamic adjusting RFID demodulator circuit comprising:
    an envelope detector having an input for receiving a modulated RF signal;
    a fixed reference coupled to the input of an RC filter; and
    a comparator having a first input coupled to an output of the envelope detector, a second input coupled to an output of the RC filter, and an output for providing a data output signal.

4. The demodulator circuit of claim 3 wherein the envelope detector comprises an input diode.

5. The demodulator circuit of claim 3 wherein the envelope detector comprises a parallel resistor and capacitor circuit.

6. The demodulator circuit of claim 3 wherein the envelope detector comprises an output diode.

7. The demodulator circuit of claim 3 wherein the envelope detector comprises an output resistor.

8. The demodulator circuit of claim 3 wherein the fixed reference comprises a current source.

9. The demodulator circuit of claim 8 wherein the current source comprises a bandgap derived current source.

10. The demodulator circuit of claim 3 wherein the fixed reference comprises a diode-connected transistor.

11. The demodulator circuit of claim 10 wherein the diode-connected transistor comprises an N-channel transistor.

12. The demodulator circuit of claim 3 wherein the first input of the comparator comprises a positive input and the second input comprises a negative input.

13. The method of claim 1 wherein providing an envelope detector and an RC filter coupled to the envelope detector comprises providing an envelope detector including an output diode and an output resistor through which the RC filter is coupled to the envelope detector.

14. The method of claim 1 further comprising providing a fixed reference coupled to the input of an RC filter.

15. The method of claim 1 wherein increasing the threshold of the RFID demodulator circuit comprises injecting current into the output of the RC filter at the second input to the comparator at higher power levels.

16. The demodulator circuit of claim 2 further comprising a fixed reference coupled to the input of an RC filter.

17. The demodulator circuit of claim 16 wherein the fixed reference comprises a current source coupled to an input of an RC filter.

18. The demodulator circuit of claim 17 wherein the fixed reference further comprises a diode-connected transistor.

19. The demodulator circuit of claim 2 wherein the envelope detector comprises an output diode.

20. The demodulator circuit of claim 2 wherein the envelope detector comprises an output resistor.

* * * * *